US012805101B2

(12) United States Patent
Soer et al.

(10) Patent No.: US 12,805,101 B2
(45) Date of Patent: Nov. 17, 2026

(54) LAMINATED LIGHT SOURCE HAVING A LOW-DENSITY SET OF LIGHT-EMITTING ELEMENTS

(71) Applicant: Lumileds LLC, San Jose, CA (US)

(72) Inventors: Wouter Soer, Utrecht (NL); Grigoriy Basin, San Francisco, CA (US); Brendan Jude Moran, San Jose, CA (US); Willem Sillevis-Smitt, San Jose, CA (US)

(73) Assignee: LUMILEDS SINGAPORE PTE. LTD., Singapore (SG)

( * ) Notice: Subject to any disclaimer, the term of this patent is extended or adjusted under 35 U.S.C. 154(b) by 862 days.

(21) Appl. No.: 17/985,893

(22) Filed: Nov. 13, 2022

(65) Prior Publication Data

US 2024/0162199 A1 May 16, 2024

Related U.S. Application Data

(60) Provisional application No. 63/352,517, filed on Jun. 15, 2022.

(51) Int. Cl.
*H01L 25/075* (2006.01)
*G02B 27/00* (2006.01)
(Continued)

(52) U.S. Cl.
CPC ..... *H10H 29/8508* (2025.01); *G02B 27/0093* (2013.01); *G02B 27/0172* (2013.01);
(Continued)

(58) Field of Classification Search
CPC ............ G02B 27/0172; G02B 27/0093; G02B 27/0101; G02B 2027/0112;
(Continued)

(56) References Cited

U.S. PATENT DOCUMENTS 10,025,095 B2 7/2018 Asai
10,132,478 B2 * 11/2018 Vasylyev ................. F21V 9/30
(Continued)

FOREIGN PATENT DOCUMENTS

JP 2017044868 A * 3/2017
KR 10-0866780 B1 11/2008
(Continued)

OTHER PUBLICATIONS

From the Korean Intellectual Property Office (KIPO) as the ISA, "Notification of Transmittal of the International Search Report and the Written Opinion of the International Searching Authority or the Declaration", PCT/US2023/025319, Oct. 10, 2023, 10 pages.

*Primary Examiner* — William R Alexander
*Assistant Examiner* — Alaina Marie Swanson

(57) ABSTRACT

An inventive light source includes a rigid layer, a polymer layer, and a set of multiple light-emitting elements. The polymer layer is attached to the rigid layer to form a laminated structure that is reflective for visible light. The set of multiple light-emitting elements is positioned between the rigid layer and the polymer layer. Each light-emitting element includes one or more inorganic microLEDs that are arranged to generate and emit output light to propagate out-of-plane relative to a corresponding localized area of the laminated structure surrounding that light-emitting element. Each light-emitting element of the set is sufficiently small in at least one transverse dimension, and the light-emitting elements occupy a sufficiently small fraction of an areal extent of the set, so as to enable visual observation of a scene reflected by the laminated structure along a sight line that passes through the set of light-emitting elements.

19 Claims, 14 Drawing Sheets

(51) Int. Cl.

| | |
|---|---|
| ***G02B 27/01*** | (2006.01) |
| ***G06F 3/01*** | (2006.01) |
| ***H01L 23/538*** | (2006.01) |
| ***H01L 33/52*** | (2010.01) |
| ***H01L 33/62*** | (2010.01) |
| ***H05B 45/30*** | (2020.01) |
| ***H10H 20/85*** | (2025.01) |
| ***H10H 20/852*** | (2025.01) |
| ***H10H 20/853*** | (2025.01) |
| ***H10H 20/856*** | (2025.01) |
| ***H10H 20/857*** | (2025.01) |
| ***H10H 29/14*** | (2025.01) |
| ***H10H 29/85*** | (2025.01) |
| ***H10W 70/60*** | (2026.01) |
| ***H10W 70/67*** | (2026.01) |
| ***H10W 90/00*** | (2026.01) |
| *H10H 20/01* | (2025.01) |

(52) U.S. Cl.
CPC ............. *G06F 3/013* (2013.01); *H05B 45/30* (2020.01); *H10H 20/8506* (2025.01); *H10H 20/852* (2025.01); *H10H 20/853* (2025.01); *H10H 20/856* (2025.01); *H10H 20/857* (2025.01); *H10H 29/142* (2025.01); *H10W 70/611* (2026.01); *H10W 70/688* (2026.01); *H10W 90/00* (2026.01); *G02B 27/0101* (2013.01); *G02B 2027/0112* (2013.01); *G02B 2027/0145* (2013.01); *G02B 2027/0178* (2013.01); *G02B 2027/0196* (2013.01); *H10H 20/0362* (2025.01); *H10H 20/0363* (2025.01); *H10H 20/0364* (2025.01)

(58) Field of Classification Search
CPC .... G02B 2027/0145; G02B 2027/0178; G02B 2027/0196; G02B 2027/0118; G02B 27/017; G06F 3/013; H01L 23/5387; H01L 25/0753; H05B 45/30; H10H 20/8506; H10H 20/852; H10H 20/853; H10H 20/856; H10H 20/857; H10H 29/142; H10H 20/0362; H10H 20/0363; H10H 20/0364; H10H 20/018
USPC .......................................................... 359/630
See application file for complete search history.

(56) References Cited

U.S. PATENT DOCUMENTS

| | | | | |
|---|---|---|---|---|
| 10,718,886 | B1 | 7/2020 | Sharma et al. | |
| 10,734,269 | B1 * | 8/2020 | Golda | H01L 24/03 |
| 11,276,672 | B1 | 3/2022 | Wu et al. | |
| 11,579,444 | B1 | 2/2023 | Sudhir et al. | |
| 2009/0213037 | A1 | 8/2009 | Schon | |
| 2015/0201475 | A1 | 7/2015 | Yin | |
| 2016/0061396 | A1 | 3/2016 | Basua et al. | |
| 2016/0124236 | A1 | 5/2016 | Kroon et al. | |
| 2017/0187976 | A1 | 6/2017 | Cok | |
| 2017/0254518 | A1 * | 9/2017 | Vasylyev | F21V 21/14 |
| 2018/0217665 | A1 | 8/2018 | Konstantatos et al. | |
| 2019/0198709 | A1 | 6/2019 | Wildeson et al. | |
| 2019/0361523 | A1 | 11/2019 | Sharma et al. | |
| 2020/0035882 | A1 | 1/2020 | Brodoceanu et al. | |
| 2020/0089318 | A1 * | 3/2020 | Brennan | G06F 3/013 |
| 2021/0041692 | A1 | 2/2021 | Zhang et al. | |
| 2021/0097943 | A1 | 4/2021 | Wyatt | |
| 2021/0183943 | A1 * | 6/2021 | Mori | B60J 1/02 |
| 2021/0191145 | A1 | 6/2021 | Schrama et al. | |
| 2021/0263342 | A1 * | 8/2021 | Ouderkirk | G02B 27/0172 |
| 2021/0343222 | A1 | 11/2021 | Hei et al. | |
| 2022/0320251 | A1 | 10/2022 | Cai et al. | |
| 2023/0100656 | A1 | 3/2023 | Georgiou et al. | |
| 2023/0163264 | A1 | 5/2023 | Li et al. | |
| 2024/0160017 | A1 | 5/2024 | Soer et al. | |
| 2024/0162198 | A1 | 5/2024 | Soer et al. | |
| 2024/0162200 | A1 | 5/2024 | Soer et al. | |
| 2024/0162273 | A1 | 5/2024 | Soer et al. | |
| 2024/0162274 | A1 | 5/2024 | Soer et al. | |
| 2025/0169235 | A1 | 5/2025 | Byun et al. | |

FOREIGN PATENT DOCUMENTS

| | | | |
|---|---|---|---|
| KR | 10-2019-0042978 | A | 4/2019 |
| KR | 10-2456595 | B1 | 10/2022 |
| WO | 2023/244675 | A1 | 12/2023 |

* cited by examiner

LAMINATED LIGHT SOURCE HAVING A LOW-DENSITY SET OF LIGHT-EMITTING ELEMENTS

This application claims benefit of U.S. provisional App. No. 63/352,517 entitled "LED array between flexible and rigid substrates" filed Jun. 15, 2022 in the names of Soer et al.

FIELD OF THE INVENTION

The field of the present invention relates to light sources. In particular, a "line-of-sight" or "look-through" light source is disclosed that includes a low-density set of light-emitting elements.

SUMMARY

An inventive light source includes a rigid layer, a polymer layer, and a set of multiple light-emitting elements. The polymer layer is attached to the rigid layer to form a laminated structure that is reflective for visible light. The set of multiple light-emitting elements is positioned between the rigid layer and the polymer layer. Each light-emitting element includes one or more inorganic microLEDs that are arranged to generate and emit output light to propagate out-of-plane relative to a corresponding localized area of the laminated structure surrounding that light-emitting element. Each light-emitting element of the set is sufficiently small in at least one transverse dimension, and the light-emitting elements occupy a sufficiently small fraction of an areal extent of the set, so as to enable visual observation of a scene reflected by the laminated structure along a sight line that passes through the set of light-emitting elements.

Objects and advantages pertaining to sets of light-emitting elements may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Figure 1A:
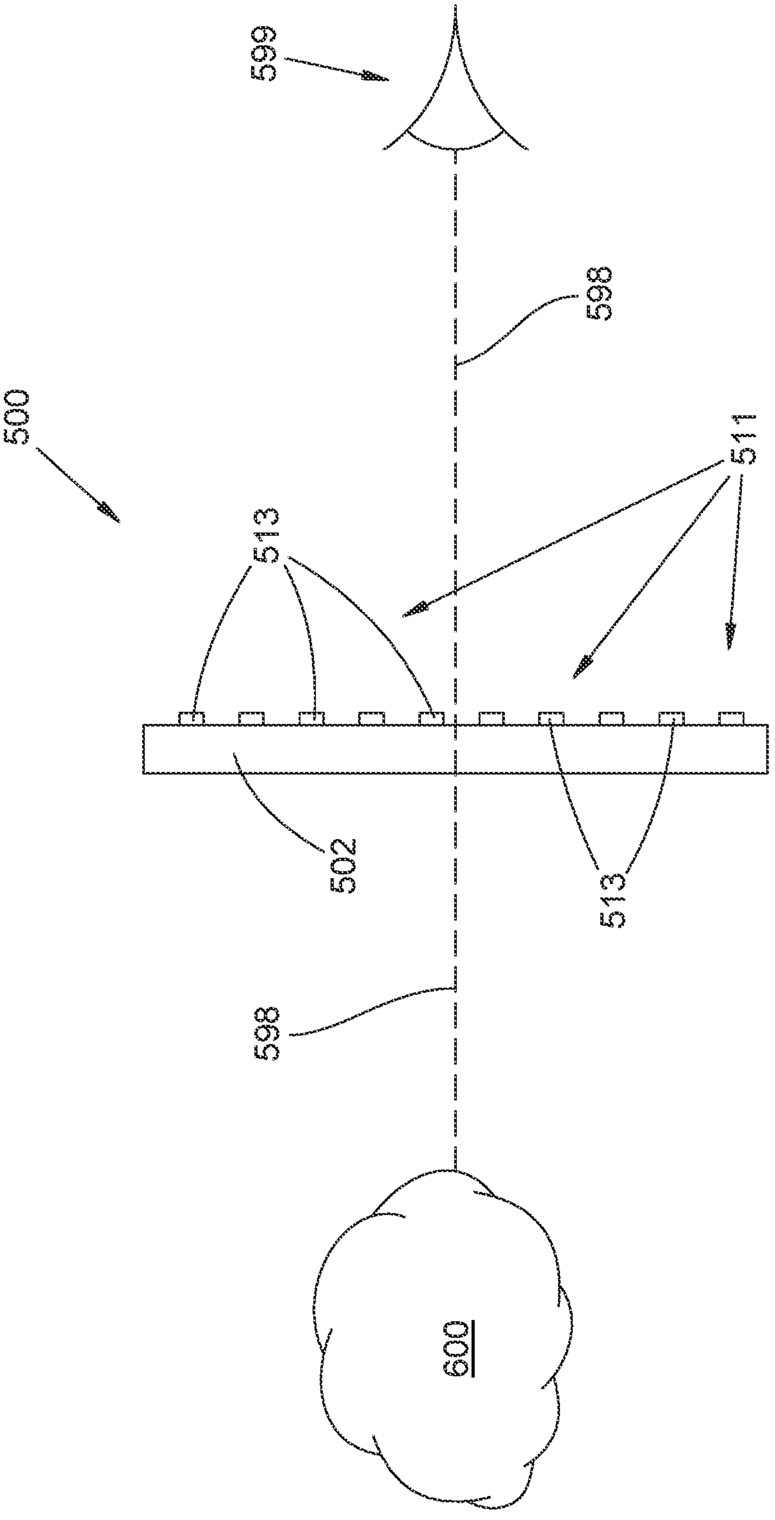
FIGS. 1A and 1B illustrate schematically transmissive and reflective geometries, respectively, for a low-density set of light-emitting elements.

The embodiments depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, the transverse or vertical dimensions of individual light-emitting elements depicted in the drawings may be exaggerated relative to, e.g., their pitch or spacing, or to the thickness of a substrate or other layers. In particular, although the disclosed light sources are intended to be, e.g., only negligibly visible to the naked eye, in some of the drawings the sizes of light-emitting elements might be unrealistically exaggerated (and therefore quite visible) to enable schematic illustration of their arrangement. In some of the drawings only a few light-emitting elements are shown for illustrative purposes, while an actual light source might have a larger number of light-emitting element. Some schematic illustrations of example structures of various devices or assemblies described herein may be shown with precise right angles and straight lines, but it is to be understood that such schematic illustrations may not reflect real-life process limitations or defects. Such process limitations or defects can cause the features to look not so "ideal" when any of the structures described herein are examined using, e.g., optical microscopy images, scanning electron microscopy (SEM) images, or transmission electron microscope (TEM) images. In such images of real structures, possible processing limitations or defects might be visible, e.g., not-perfectly straight edges of materials, slanted side walls, tapered vias or other openings, inadvertent rounding of corners, or variations in thicknesses of different material layers. There may be other limitations or defects not listed here that can occur within the field of device fabrication. The embodiments shown are only examples and should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the disclosed inventive subject. The detailed description illustrates by way of example, not by way of limitation, the principles of the disclosed inventive subject matter.

There are a number of scenarios in which it is necessary or desirable to track position or movement of eyes or head of a human observer. For example, such tracking can be employed in a vehicle to monitor the attention of a driver. In other examples, such tracking can be employed to estimate the direction of a user's gaze in a visualization system (e.g., a virtual reality (VR) system or an augmented reality (AR) system), or in a static or dynamic electronic display (e.g., a video or data monitor, electronic signage, electronic out-of-home advertising, and so forth). Such eye-tracking information can in turn be used to guide generation or alteration of audiovisual content presented to the user in the visualization system or on the electronic display. Typically, one or more light sources are used to illuminate the user's eyes or face (often using infrared light to avoid distracting the user), and a sensor or detector (e.g., an imaging sensor) is employed to detect light reflected or scattered from the user's eye or face. Processing of the resulting signals yields an estimate of the direction of the user's gaze.

Previous eye-tracking systems have included illuminating light sources located at oblique angles relative to the user's line of sight. One common arrangement includes a set of light sources positioned on the peripheral frame of a set of AR/VR eyewear (e.g., glasses or goggles) or other wearable optical assembly. In some systems such AR/VR eyewear might be provided solely for providing eye tracking, with visual content of the AR/VR environment delivered using a separate screen or display (e.g., a head-mounted display, faceplate, or visor, or a display screen or window). In other AR/VR systems the eyewear with the eye-tracking light sources can also be used for delivering visual content of the AR/VR system, by forming images on the lenses or windows of the eyewear.

The oblique illumination provided by previous eye-tracking hardware is disadvantageous for several reasons. The locations of the sources on the peripheral frame of the eyewear place them at greater distance from the eye, so that correspondingly higher optical power might be needed to produce an adequately detectable signal. The oblique incidence angle of the light on the eye might also reduce the amount of light returned to the sensor or detector, also requiring higher-output light sources or more sensitive sensors or detectors. Accuracy of the estimated direction of the user's gaze might be limited by use of only off-axis light to illuminate the eye. Therefore it would be desirable to provide an illuminating light source that can be placed in an observer's line of sight so as to more directly illuminate the observer's eyes or face, while also not substantially interfering with observation of a scene along the observer's line of sight through the light source. Similarly, in an automotive setting it would be desirable to place a light source for illuminating the driver's eyes or face within the driver's line of sight without interfering substantially with the driver's vision. Such a "line-of-sight" or "look-through" light source could also be advantageously employed in other scenarios or for other purposes, some of which are described below.

Figure 1B:
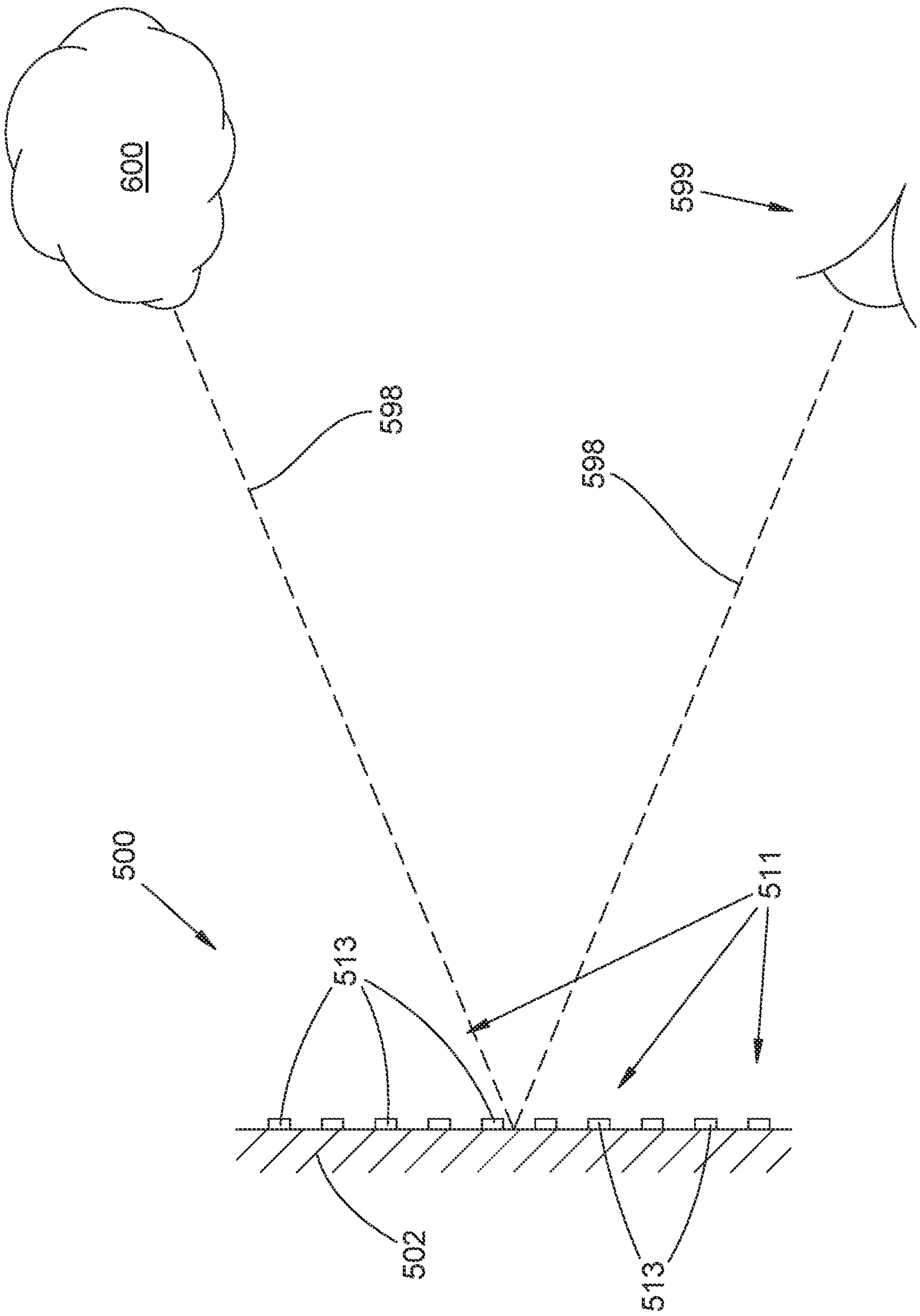

Accordingly, an inventive light source 500 comprises a substrate 502 and a set 511 of multiple discrete light-emitting elements 513. The substrate 502 is transparent or reflective for visible light (e.g., light having a vacuum wavelength between about 400 nm and about 700 nm). "Transparent" denotes sufficient transmission of visible light for the light source 500 to operate as needed in a given context. "Reflective" similarly denotes sufficient reflection of visible light for the light source 500 to operate as needed in a given context. Reflectivity of the substrate 502 can be provided in some instances by the inherent reflectivity of a surface of the substrate material, or in other instances can be imparted by a suitable reflective coating (e.g., metallic, multilayer dielectric, and so forth) on a surface of the substrate 502. The general transmissive and reflective geometries are illustrated schematically in FIGS. 1A and 1B, respectively. Much of the ensuing description applies generally to both geometries, except where only one or the other geometry is specifically mentioned. In some examples the substrate 502 can be partially transmissive and partially reflective.

Figure 2:
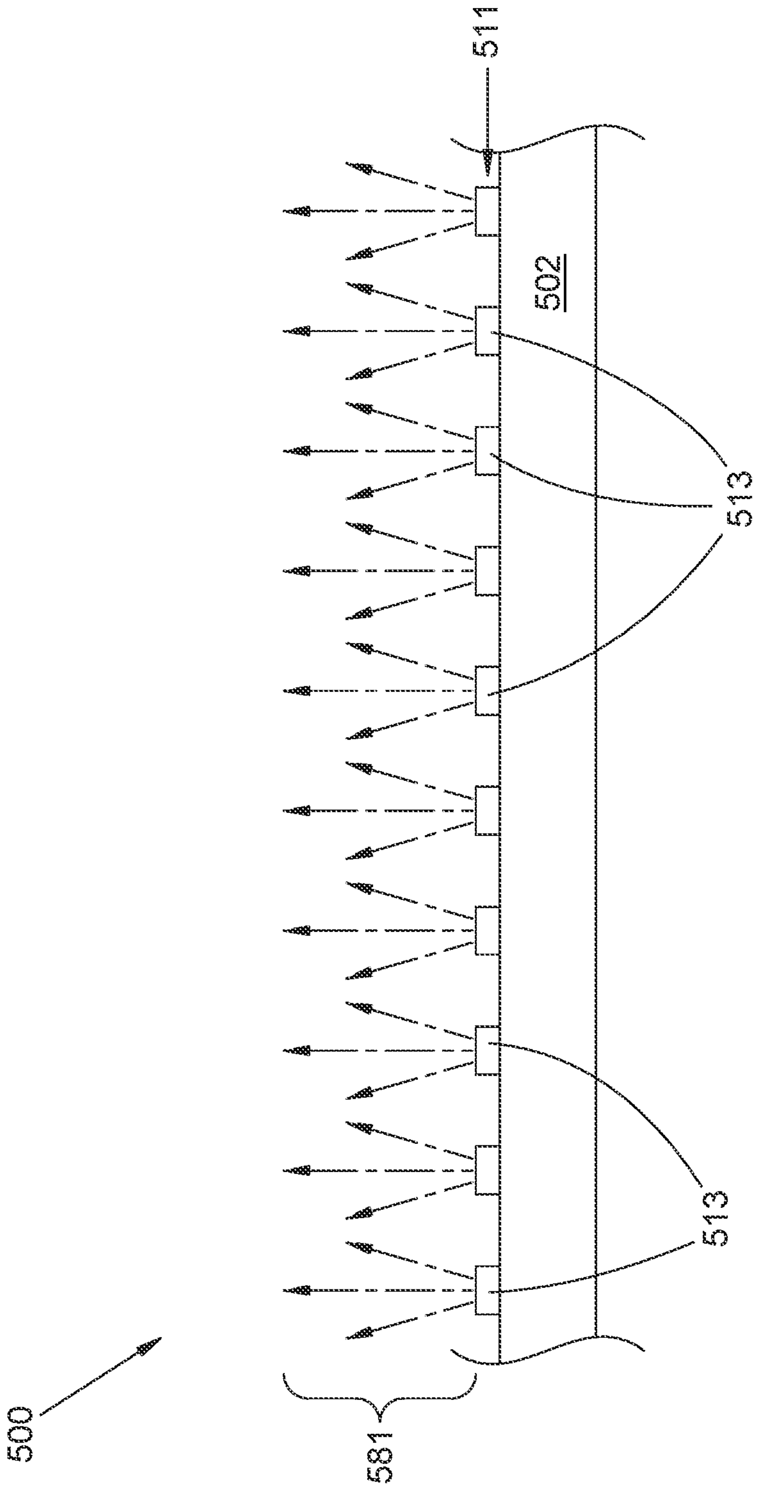
FIG. 2 is a schematic cross-sectional view of a low-density set of light-emitting elements on a substrate.

The set 511 of multiple discrete light-emitting elements 513 is positioned on or within the substrate 502, with each light-emitting element 513 being arranged to emit output light 581 out-of-plane relative to a corresponding localized area of the substrate 502 surrounding that light-emitting element 513 (e.g., illustrated schematically in FIG. 2). In other words, the light source 500 is not intended to function by lateral propagation of light within the substrate 502, but by generation and emission of output light 581 by the light-emitting elements 513 to propagate away from one or both surfaces of the substrate 502. Note that in a system incorporating the light source 500, it is possible that other components of that system could operate by lateral propagation of light within the substrate 502 or within another substrate on which the substrate 502 is positioned. In many examples output light 581 emitted by each light-emitting element 513 propagates in an angular distribution centered about the surface normal vector of the substrate 502 at the location of that light-emitting element 513. The set 511 can be referred to as low-density or sparse, meaning that each light-emitting element 513 is sufficiently small in one or both transverse dimensions (i.e., dimensions locally parallel to the substrate surface), and that the light-emitting elements 513 of the set 511 occupy a sufficiently small fraction of an areal extent 506 of the set 511, so as to enable visual observation of a scene 600 through or reflected by the substrate 502 along a sight line 598 that passes through the set of light-emitting elements 511.

In some examples (e.g., as in the example of FIG. 2) at least some of light-emitting elements 511 can be positioned on one surface of the substrate 502 and at least some of the output light 581 from those elements 511 can propagate away from that same surface of the substrate 502. In some examples (not shown) at least some of the light-emitting elements 511 can be positioned on one surface of the substrate 502 and at least some of the output light 581 from those elements 511 can propagate through the substrate 502 to propagate away from the opposite surface thereof. In some examples (not shown) at least some of the light-emitting elements 511 can be positioned within the substrate 502. In some such examples all of the output light 581 of those elements 511 can propagate through a portion of the substrate 502 and away from either one surface of the substrate 502 or the other surface but not both; in other such examples one portion of the output light 581 of those elements 511 can propagate through a portion of the substrate 502 and away from one surface thereof, while another portion of the output light 581 can propagate through a portion of the substrate 502 and away from the opposite surface thereof.

Figure 3A:
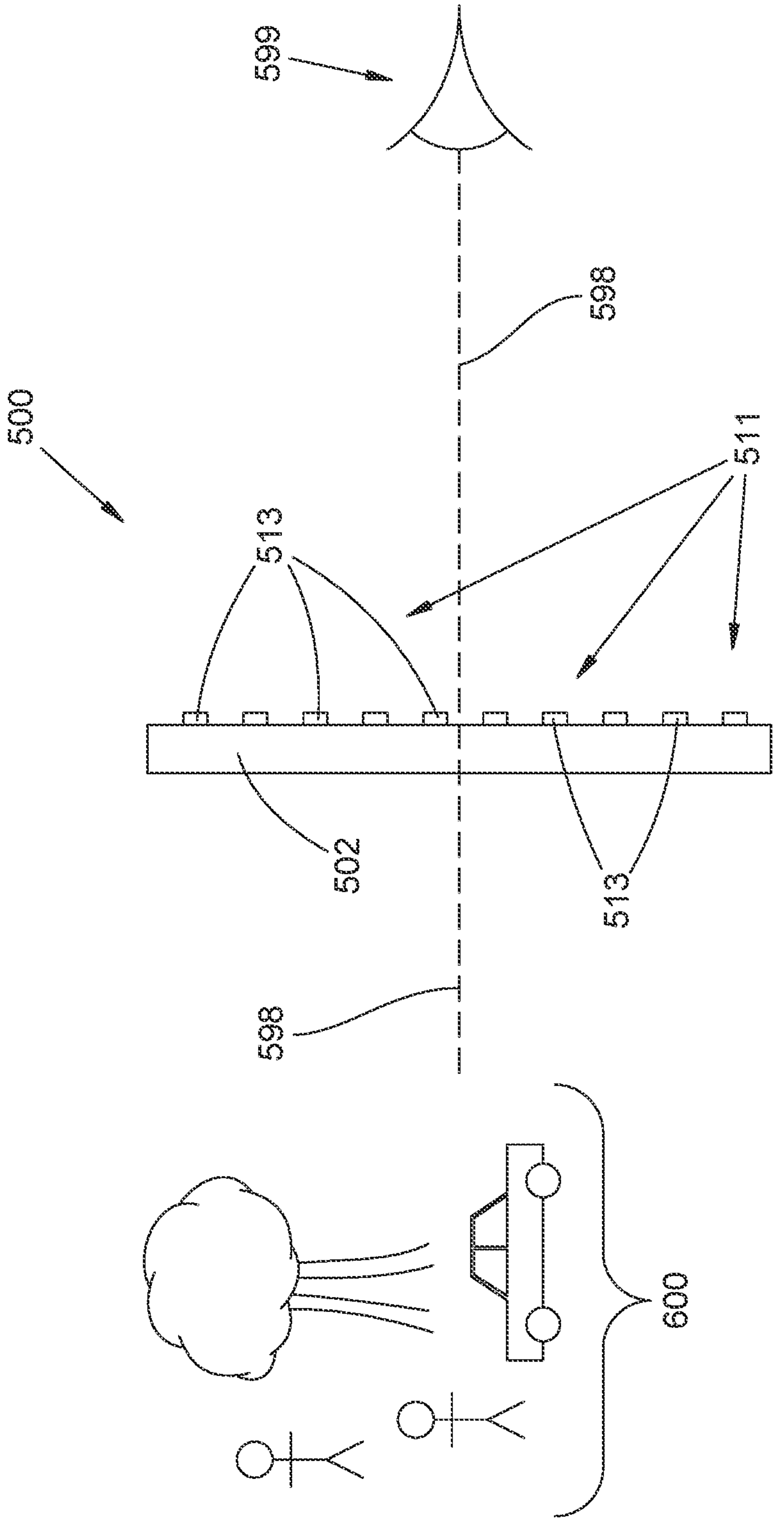
FIGS. 3A through 3C illustrate schematically observation of actual, virtual, and mixed scenes, respectively, through a low-density set of light-emitting elements.
Figure 3B:
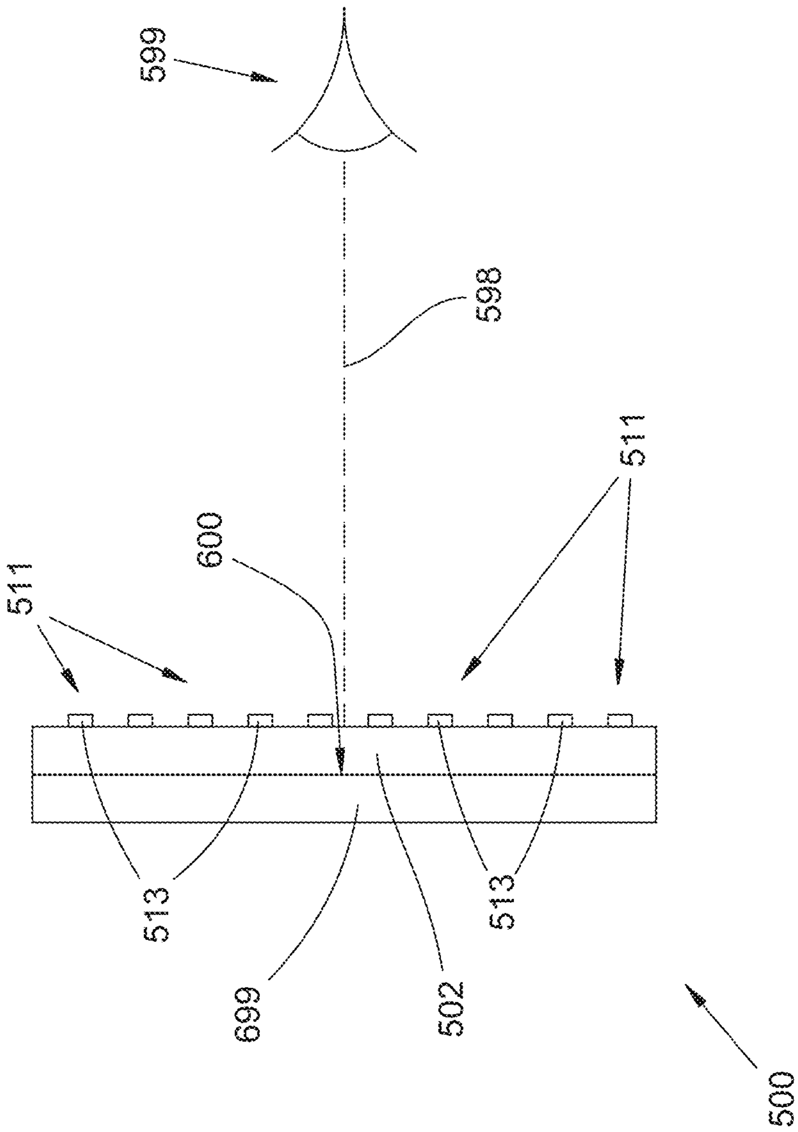
Figure 3C:
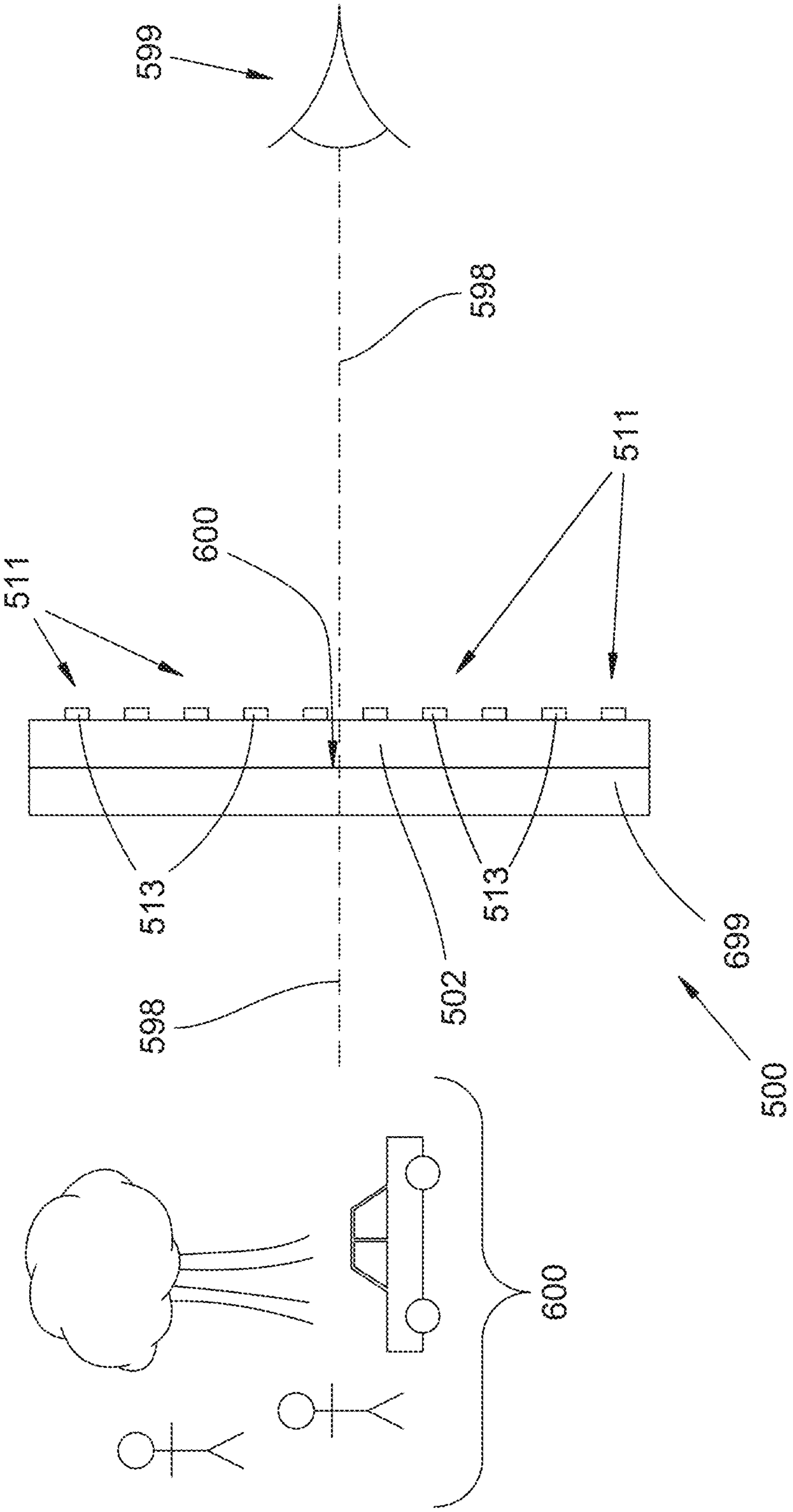

In some examples the scene 600 can be a region of actual space that is viewed by a human observer 599 along the human observer's line of sight 598 through the substrate 502 (e.g., as in FIG. 3A) or reflected from the substrate 502; the region of space constituting the scene 600 can include any one or more structures, objects, or people located in that region of space (as illustrated schematically in FIG. 3A). In some examples the scene 600 can be an image (static or moving) that is formed on an electronic display 699 (e.g., computer, tablet, television, or phone screen; electronic signage or billboard display; VR eyewear or headset) within the line of sight 598 of the human observer 599 and that is viewed by the human observer 599 through the substrate 502 (e.g., as illustrated schematically in FIG. 3B) or reflected from the substrate 502. In some of those examples the display 699 can be offset separated from the light source 500; in others of those examples the light source 500 can be positioned on the surface of the display 699 (e.g., as in FIG. 3B) or be incorporated into the display 699. In a specific example the display 699 can include suitably modulated edge light sources that launch light to propagate laterally within the substrate 502 to create images seen by the human observer. In some examples (e.g., AR eyewear or headset; transparent window) the scene 600 can include both a region of actual space and a superimposed image formed on a display 699 through which the region of actual space is viewed (as illustrated schematically in FIG. 3C). Each of those scenarios is discussed in further detail below.

In some examples the light-emitting elements 513 of the set 511 can be small enough and spread far enough apart on the substrate 502 so that, with the light-emitting elements 513 in an off state or emitting only infrared light, the set 511 does not substantially interfere with visual observation of the scene 600 by a naked eye of a human observer 599, through the substrate 502 or reflected by the substrate 502, along the line of sight 598 that passes through the set 511. Note that the "naked eye" of the human observer might include ordinary vision-corrective lenses, such as eyeglasses or contact lenses, that are used to improve daily vision in people having refractive errors. In some examples the light-emitting elements 513 of the set 511 can be small enough and spread far enough apart on the substrate 502 so that, when they are in an off state or emitting only infrared light, they are effectively invisible to the naked eye of the human observer 599.

In some examples, the light-emitting elements 513, although small and spread apart, when in an off state or emitting only infrared light they may nevertheless be visible to the naked eye. In such examples, if a transparent substrate 502 with a low-density set 511 of light-emitting elements 513 were held up to a solid white background, or if a light were shone on the set 511 at an oblique angle, an attentive human observer might discern the presence of the set 511 (e.g., by slight discoloration or grainy appearance of the substrate 502, or light scattered from the light-emitting elements 513), even with the light-emitting elements 513 in an off state or emitting only infrared light. But like dust on a television or computer screen, which might be somewhat apparent when the screen is dark, and more readily apparent when a light shines obliquely across the dark screen, that dust can easily go unnoticed by a human observer when images are displayed on the screen, effectively disappearing from view. Similarly, dust on eyeglasses might be visible with the eyeglasses held up to a light to look for the dust, but can easily go unnoticed by the wearer observing a scene through those same dusty eyeglasses. That same phenomenon is exploited by the low-density arrangement of the set 511 of light-emitting elements 513 of the light source 500. Such a set 511 in some instances can be characterized as being only negligibly visible, or as resembling dust on the substrate 502.

Figure 4:
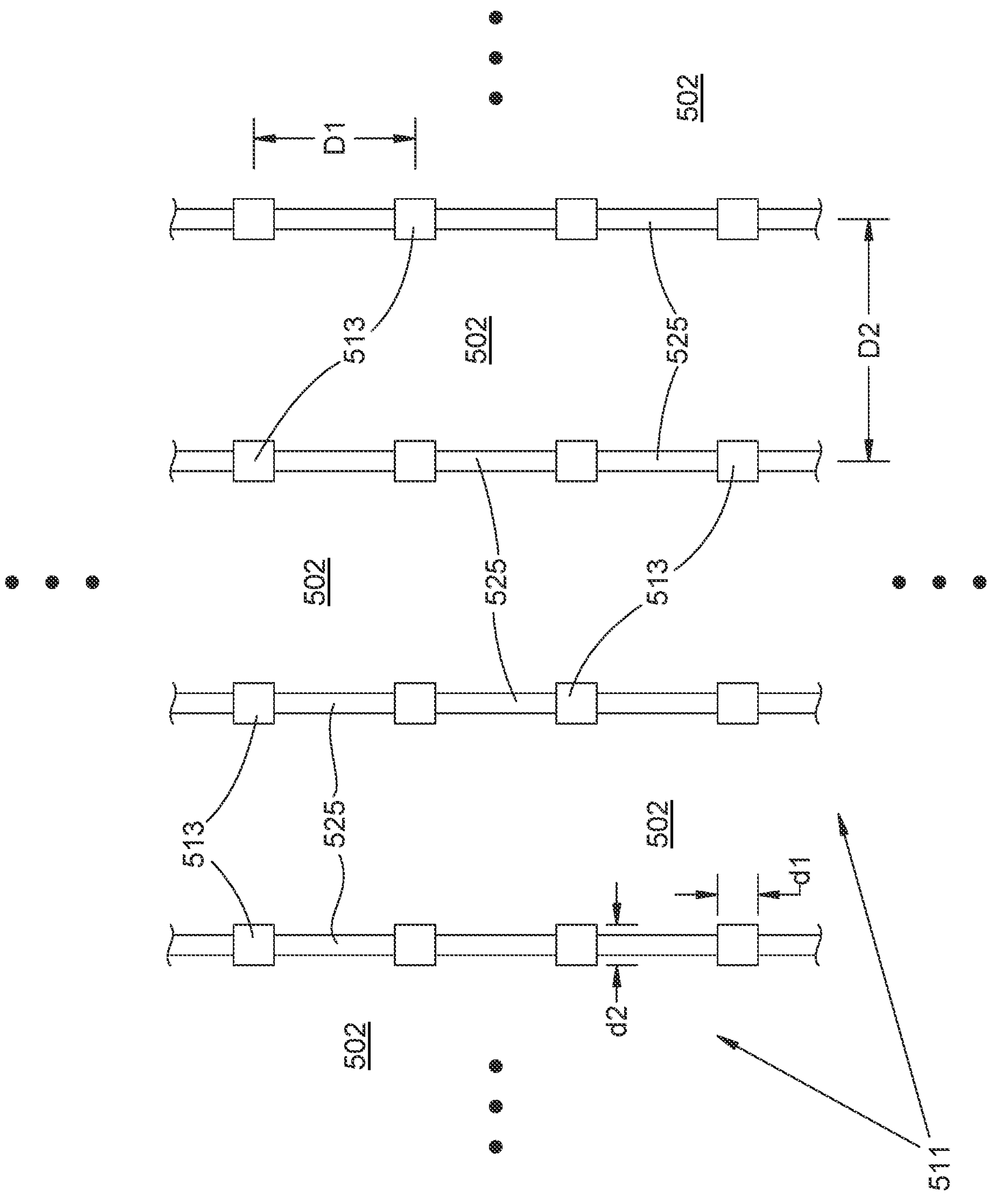
FIG. 4 illustrates schematically a plan view of a portion of a low-density set of light-emitting elements and electrical traces on a substrate.

The light source 500 can include multiple electrically conductive traces 525 on the substrate 502 that are arranged for providing electrical drive current to the light-emitting elements 513 of the set 511 (illustrated schematically in FIG. 4). In some examples the conductive traces 525 can include transparent traces and can include one or more materials among indium tin oxide (ITO), indium zinc oxide (IZO), or one or more other transparent conductive oxides (TCOs). Such transparent traces can be sufficiently transparent, or sufficiently narrow and spaced sufficiently far apart, so that they also (like the light-emitting elements 513) enable visual observation of the scene 600 through or reflected by the substrate 502 along the sight line 598 that passes through the set of electrically conductive traces 525. In some examples the conductive traces 525 can include metallic traces and can include one or more materials among aluminum, silver, gold, or one or more other metals or metallic alloys. Such metallic traces can be sufficiently narrow and spaced sufficiently far apart so that they also (like the light-emitting elements 513) enable visual observation of the scene 600 through or reflected by the substrate 502 along the sight line 598 that passes through the set of electrically conductive traces 525. The conductive traces 525 of either or both types in some instances can be characterized as only negligibly visible, as resembling dust on the substrate 502, or as not substantially interfering with visual observation of the scene 600 by the naked eye 599 of the human observer, through or reflected by the substrate 502, along the line of sight 598 that passes through the traces 525.

Figure 10B:
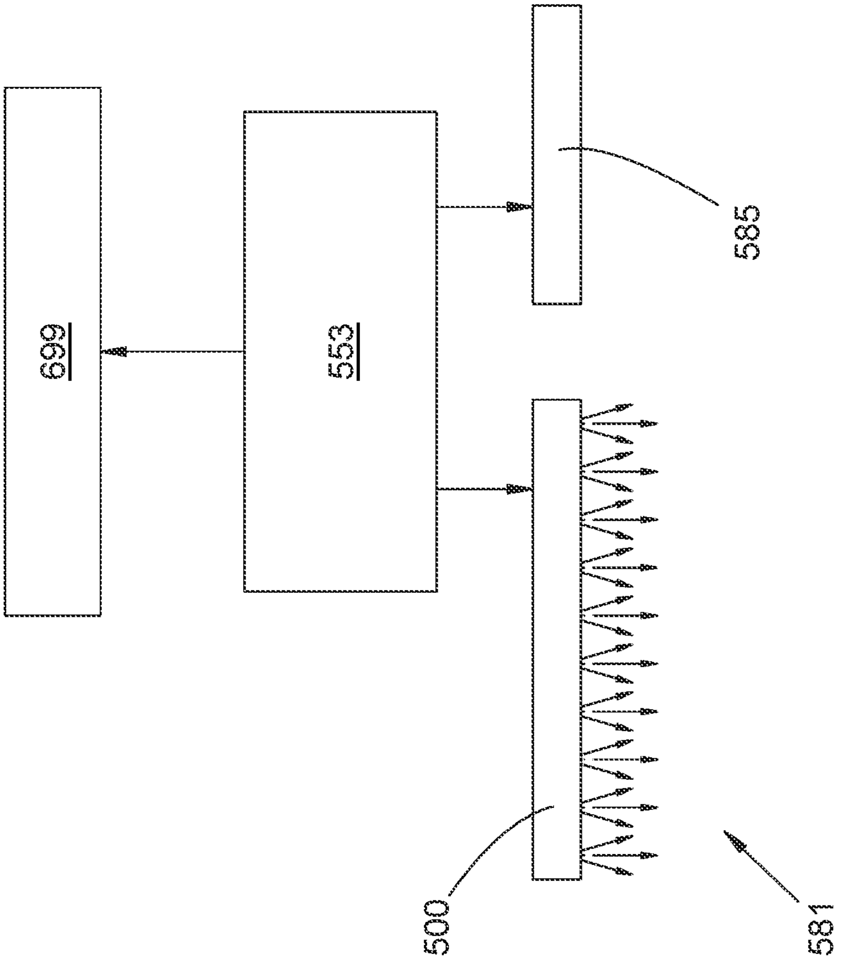
FIG. 10B illustrates schematically a low-density set of light emitting elements connected to a control circuit that is also connected to a photodetector, photodetector array, or image sensor and to an electronic display.
Figure 10A:
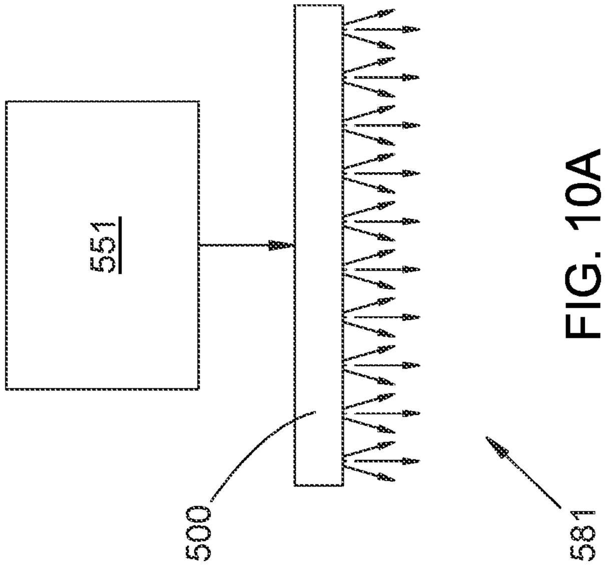
FIG. 10A illustrates schematically a power supply connected to a low-density set of light-emitting elements.
Figure 11:
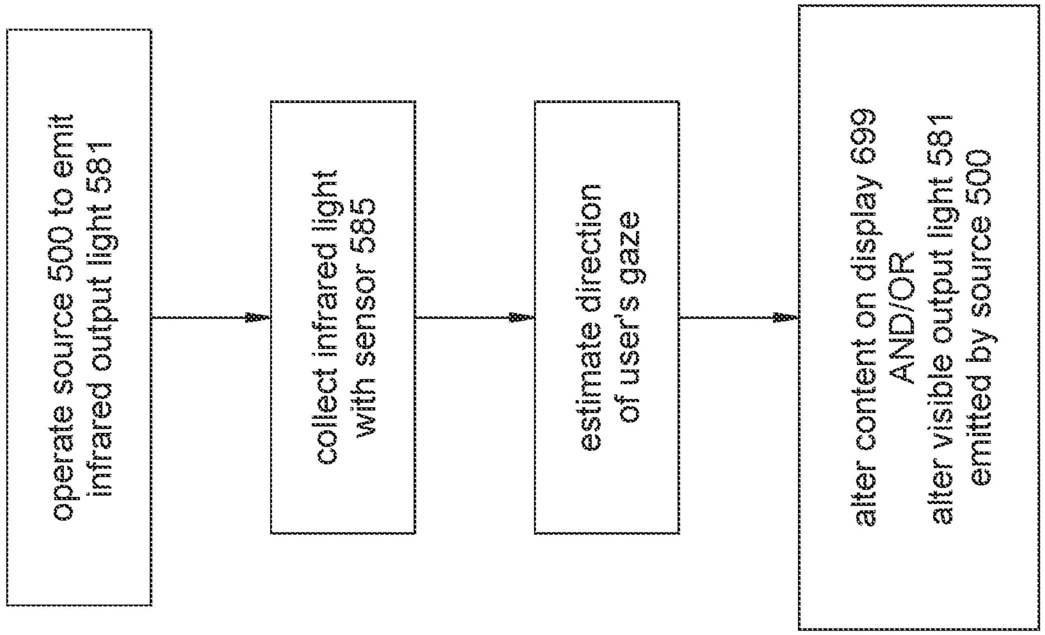
FIG. 11 is a flow diagram representing an example method of using a low-density set of light-emitting elements.

In some examples all of the light-emitting elements 513 of the set 511 can be connected to a source of electrical current (e.g., a power supply 551 as in FIG. 10A, or a control circuit 553 as in FIG. 10B) so as to operate in unison. In some such examples one or more or all of the traces 525 can constitute a single conductive element so that multiple light-emitting elements 513 can be connected, e.g., in series. In other such examples one or more or all of the traces 525 can constitute two or more independent conductive elements so that multiple light-emitting elements 513 can be connected, e.g., in parallel. In some examples one or more or all of the light-emitting elements 513 can be connected to a control circuit 553 so as to be operable independently of one or more or all of the other light-emitting elements 513 of the set 511. In some such examples one or more or all of the traces 525 can constitute two or more independent conductive elements to enable such independent operation.

In general the light-emitting elements 513 can be of any suitable type, composition, or arrangement. In some examples the light-emitting elements 513 of the set 511 can include one or more inorganic light-emitting diodes (LEDs). In some examples each such inorganic LED 513 of the set 511 can comprise an inorganic semiconductor LED and can include one or more materials among III-V, II-VI, or Group IV semiconductor materials. In some examples one or more light-emitting elements 513 of the set 511 can include so-called direct-emitting LEDs, in which light generated by radiative recombination of charge carriers at an active layer or region of the LED constitutes the entire light output of the direct-emitting LED. In some examples one or more of the light-emitting elements 513 can include so-called phosphor-converted LEDs that include a wavelength-converting structure, e.g., one or more phosphors that absorb light at the wavelength generated by recombination in the LED and in turn emit light at one or more different, longer wavelengths. Light output of such phosphor-converted LEDs can include only light at the longer wavelength(s), or can include both direct-emitted and phosphor-converted light.

In some examples one or more of the light-emitting elements 513 (direct-emitting, phosphor-converted, or both types) of the set 511 can emit non-visible light such as infrared light (e.g., light having a wavelength longer than about 750 nm, longer than about 800 nm, or longer than about 840 nm); in some of those examples all of the elements 513 emit only non-visible light such as infrared light. In some examples one or more of the light-emitting elements 513 (direct-emitting, phosphor-converted, or both types) of the set 511 can emit visible light (e.g., light having a wavelength between about 400 nm and about 700 nm or 750 nm); in some of those examples all of the elements 513 emit only visible light. In some examples each light-emitting element 513 of the set 511 can emit light at one or more corresponding wavelengths that differ from one or more corresponding wavelengths of light emitting by at least one other light-emitting element 513 of the set 511 (i.e., the set 511 can be a multicolor set); in some other examples each light-emitting element 513 of the set 511 can emit light the same one or more wavelengths as light emitted by all other light-emitting elements 513 of the set 511 (i.e., the set 511 can be a monochrome set). In some examples one or more of the light-emitting elements 513 is a unitary element; in some of those examples all of the elements 513 are unitary elements. In some other examples one or more of the light-emitting elements 513 can be arranged as a compound element including two or more independently operable light-emitting subelements (e.g., independently operable LEDs; direct-emitting, phosphor-converted, or both types). The subelements of each compound light-emitting element 513 can emit light at corresponding wavelengths different from one another, so that the overall color of the light emitted by each compound light-emitting element 513 can be varied by varying the relative intensities emitted by each subelement. In some examples all of the light-emitting elements 513 can be arranged as compound elements.

Figure 5:
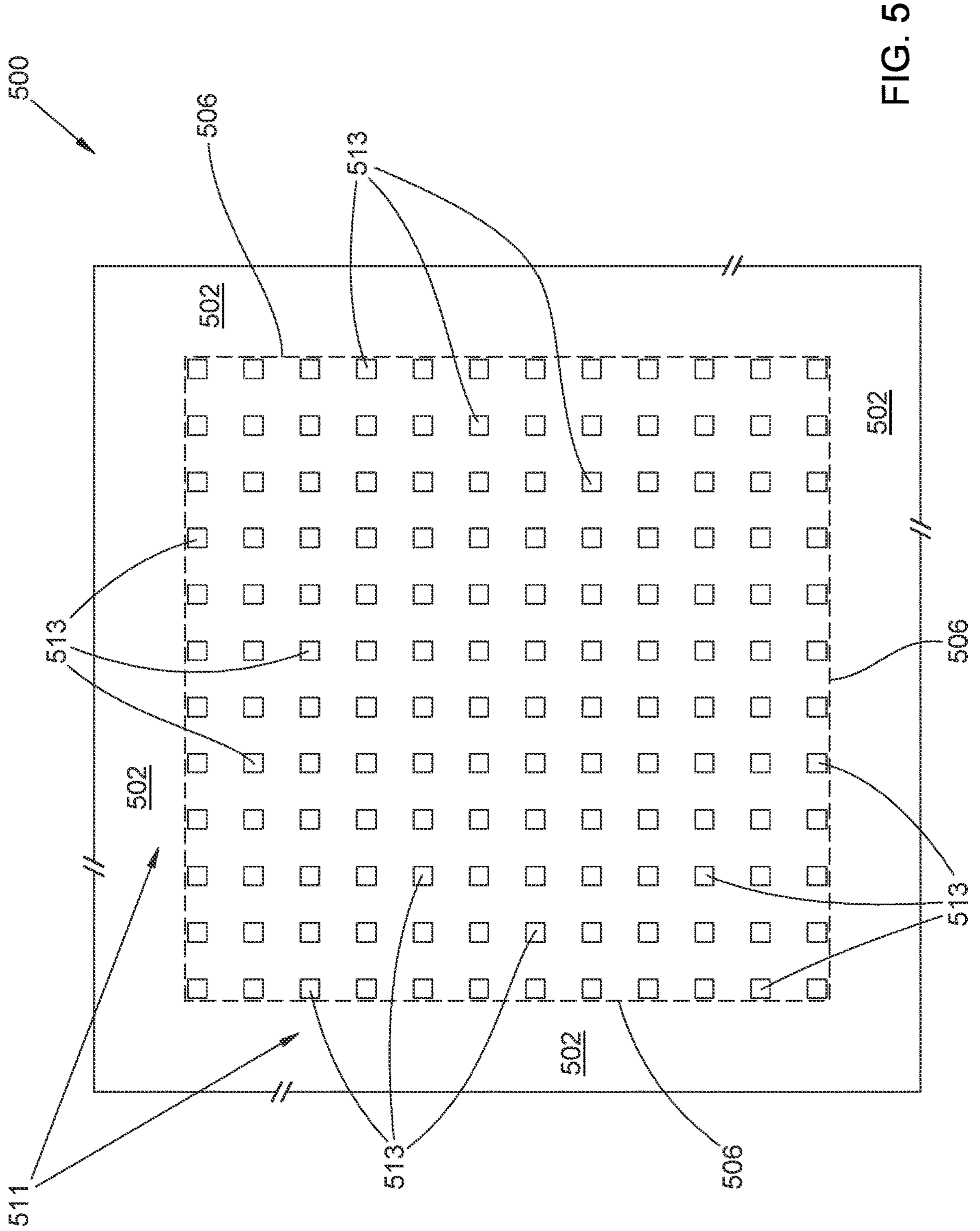
FIG. 5 illustrates schematically a plan view of a low density set of light-emitting elements on a substrate.

In some examples each light-emitting element 513 can have a largest transverse dimension (referring to FIG. 4, max(d1,d2)) that is less than 200 μm, less than 100 μm, less than 50 μm, less than 30 μm, less than 20 μm, less than 10 μm, less than 8 μm, less than 5 μm, or even smaller. LEDs of those sizes can be referred to as microLEDs. The nonzero transverse dimensions d1 and d2 of each light-emitting element 513 can be made as small as desired or practicable while still enabling the element 513 to emit light (e.g., for an LED to still function as an LED). The light-emitting elements 513 can be of any suitable shape (e.g., square, rectangular, circular, etc) and need not be the same size in both transverse dimensions; in FIG. 4 the light-emitting elements 513 are shown as being square (if d1=d2) or rectangular (if d1≠d2). In some examples spacing or pitch (center-to-center; referring to FIG. 4, min(D1,D2)) of the light-emitting elements 513 of the set 511 can be greater than 0.1 mm, greater than 0.2 mm, greater than 0.3 mm, greater than 0.5 mm, greater than 1.0 mm, greater than 2 mm, greater than 3 mm, greater than 5 mm, or even larger. The set can be of any suitable arrangement (e.g., square, rectangular, trigonal, hexagonal, or other regular or periodic array, or an aperiodic, irregular, or random arrangement). If periodic the spacing or pitch need not be the same across the entire array and need not be the same in both transverse dimensions along the surface of the substrate 502. In FIG. 4 the set 511 is shown as being arranged as a square array (if D1=D2) or as a rectangular array (if D1≠D2). In some examples the set 511 can occupy an area 506 of the substrate 502 (e.g., illustrated schematically in FIGS. 5 and 6) having a smallest transverse dimension that is greater than 5 mm, greater than 10 mm, greater than 20 mm, greater than 30 mm, greater than 50 mm, greater than 100 mm, greater than 200 mm, greater than 500 mm, or even larger. The area of the substrate 502 occupied by the set 511 can be of any suitable or desired, symmetric or asymmetric, regular or irregular shape (e.g., polygonal, circular, elliptical, oval, ring, annulus, shape of an eyewear lens or of a visor or faceplate of a helmet, and so forth). In some examples the light-emitting elements 513 of the set 511 can occupy a non-zero fraction of the area 506 of the substrate 502 occupied by the set 511 that is less than 25%, less than 10%, less than 5%, less than 2%, less than 1%, less than 0.5%, less than 0.2%, less than 0.1%, less than 0.05%, less than 0.02%, less than 0.01%, less than 0.005%, less than 0.002%, less than 0.001%, or even smaller.

In some examples the electrically conductive traces 525 can be less than 100 μm wide, less than 50 μm, less than 30 μm, less than 20 μm, less than 10 μm, less than 8 μm, less than 5 μm, or even smaller. In some examples the electrically conductive traces 525 occupy less than less than 25% of the areal extent of the set of electrically conductive traces, or less than 10%, less than 5%, less than 2%, less than 1%, less than 0.5%, less than 0.2%, less than 0.1%, less than 0.05%, less than 0.02%, less than 0.01%, less than 0.005%, less than 0.002%, less than 0.001%, or even smaller. In a manner similar to that of the light-emitting element 513, those sizes or areal fractions of the electrically conductive traces 525 enable the scene 600 to be viewed along a line of sight 598 that passes through the traces 525, for the traces 525 not to substantially interfere with visual observation of the scene 600 by the naked eye of a human observer, for the traces to be only negligibly visible to the naked eye of a human observer, or to resemble hair or dust on the substrate 502. In some examples the set of electrically conductive traces can occupy an area of the substrate 502 having a smallest transverse dimension that is greater than 5 mm, greater than 10 mm, greater than 20 mm, greater than 30 mm, greater than 50 mm, greater than 100 mm, greater than 200 mm, greater than 500 mm, or even larger. In some examples the traces might extend beyond the areal extent 506 of the set 511, for example, in arrangements wherein the areal extent 506 of the set 511 covers only a portion of the substrate 502 but some of the traces 525 extend to one or more edges of the substrate 502 to enable one or more electrical connections to, e.g., a control circuit or a power source.

In some examples (e.g., illustrated schematically in FIG. 6) the substrate 502 can be mounted on or attached to, or form a portion of, an object worn or carried by the human observer (e.g., eyewear 530 or a lens, eyepiece, mask, faceplate, visor, headset, helmet, and so forth). In some examples (e.g., illustrated schematically in FIG. 7) the substrate 502 can be mounted on or attached to, or form a portion of, a transparent window 544 (with light source 500RW) or a reflective mirror 542 (with light source 500M) of a vehicle 540, building, or other structure or object. In some examples, the entire substrate 502 can be planar (e.g., a planar window, mirror, or screen). In some examples the substrate 502 can include two or more flat portions that are not coplanar (e.g., portions of a faceted window or a foldable display). In some examples one or more portions of the substrate 502, or all of the substrate 502, can be curved (e.g., a curved windshield or rear window of a vehicle, eyewear lenses, or a faceplate or visor for a headset or helmet). In some examples the substrate 502 can be a window, lens, eyepiece, mirror, display, or other structure; in some examples the substrate 502 can be a distinct structure (e.g., a flexible, transparent polymer layer) that is attached to a window, lens, eyepiece, display, mirror, or other rigid structure.

In some examples the light source 500 can be arranged so that all of the light-emitting elements 513 of the set 511 emit output light 581 to propagate away from the same surface of the substrate 502. That is necessarily the case when the substrate 502 is reflective and the light source 500 is arranged in the reflective geometry of FIG. 1B; all of the light-emitting elements 513 would emit output light 581 to propagate generally toward the human observer 599. With a transparent substrate 502 and the light source 500 arranged in the transmissive geometry of FIG. 1A, all of the light-emitting elements 513 can be directed either forward (i.e., toward the scene 600 and away from the human observer) or backward (i.e., toward the human observer and away from the scene 600). In some other examples the light source 500 can be arranged so that some of the light-emitting elements 513 of the set 511 emit output light 581 in the forward direction and other light-emitting elements 513 of the set 511 emit output light 581 in the backward direction (as already noted above).

In some examples the light source 500 can be mounted or positioned relative to the human observer so that at least a portion of output light 581 emitted by the set 511 is directed at the human observer (i.e., is directed in the backward direction, as discussed above). Output light 581 emitted by the set 511 in the backward direction can be intended to be seen by the human observer (e.g., for presenting alphanumeric, symbolic, or image content for the human observer to see), or can be used for illuminating the human observer (e.g., for tracking eye or head movements or positions, facial or retinal detection or identification, or other biometric detection or measurement). In some instances output light 581 used for illuminating the human observer can be infrared light, so that the human observer is unaware of and undisturbed by the illuminating light; note however that visible light could be used for such illumination of the human observer. In some instances the output light 581 emitted by the light source 500 can be visible light used to display alphanumeric, symbolic, or image content on the substrate 502 to be seen by the human observer. Such displayed content formed by the light source 500 can be superimposed on the scene 600 using the display 699 (e.g., as part of an AR or VR visualization system). In some instances the set 511 can include light-emitting elements 513 that serve both purposes. For example, one subset of infrared light-emitting elements 513 can be arranged for illuminating the observer's eyes or face, and another subset of visible light-emitting elements 513 can arranged for displaying content to the observer. Such a dual-purpose arrangement could be positioned, e.g., on a vehicle windshield or rear-view mirror 542 (e.g., light source 500M as in FIG. 7) or on eyewear 530 (e.g., light source 500 as in FIG. 6) or a headset, and could be employed, e.g., to monitor the driver's or wearer's attention (through tracking eye or head movements) and simultaneously to display information to the driver or wearer (such as speed, heading, position, outside temperature, fuel status, and so forth) or superimpose markers or indicators onto the scene 600 observed by the driver or wearer. Note that the driver or wearer is the human observer 599 in such examples.

Forward-directed light-emitting elements 513 can be arranged to serve analogous purposes. For example, forward-directed infrared or visible light-emitting elements 513 can be employed for illuminating people or objects in the scene 600. In some instances visible light might be employed for general illumination of the scene 600; in other instances infrared or visible illumination can be employed for tracking, range-finding, identification or recognition, or other characterizations or measurements of people or objects within the scene 600. In some instances forward-directed visible light-emitting elements 513 can be employed for displaying alphanumeric, symbolic, or image content to other observers who are located within the scene 600. In some instances forward-directed light emitting elements 513 of both types can be employed together, e.g., on a rear window 544 of a vehicle 540 (e.g., light source 500RW as in FIG. 7) for sensing when a following vehicle follows too closely and to display a message politely suggesting to the driver of the following vehicle that he/she should back off, all without interfering with the driver's (i.e., observer's 599) ability to see through the rear window 544.

Figure 9:
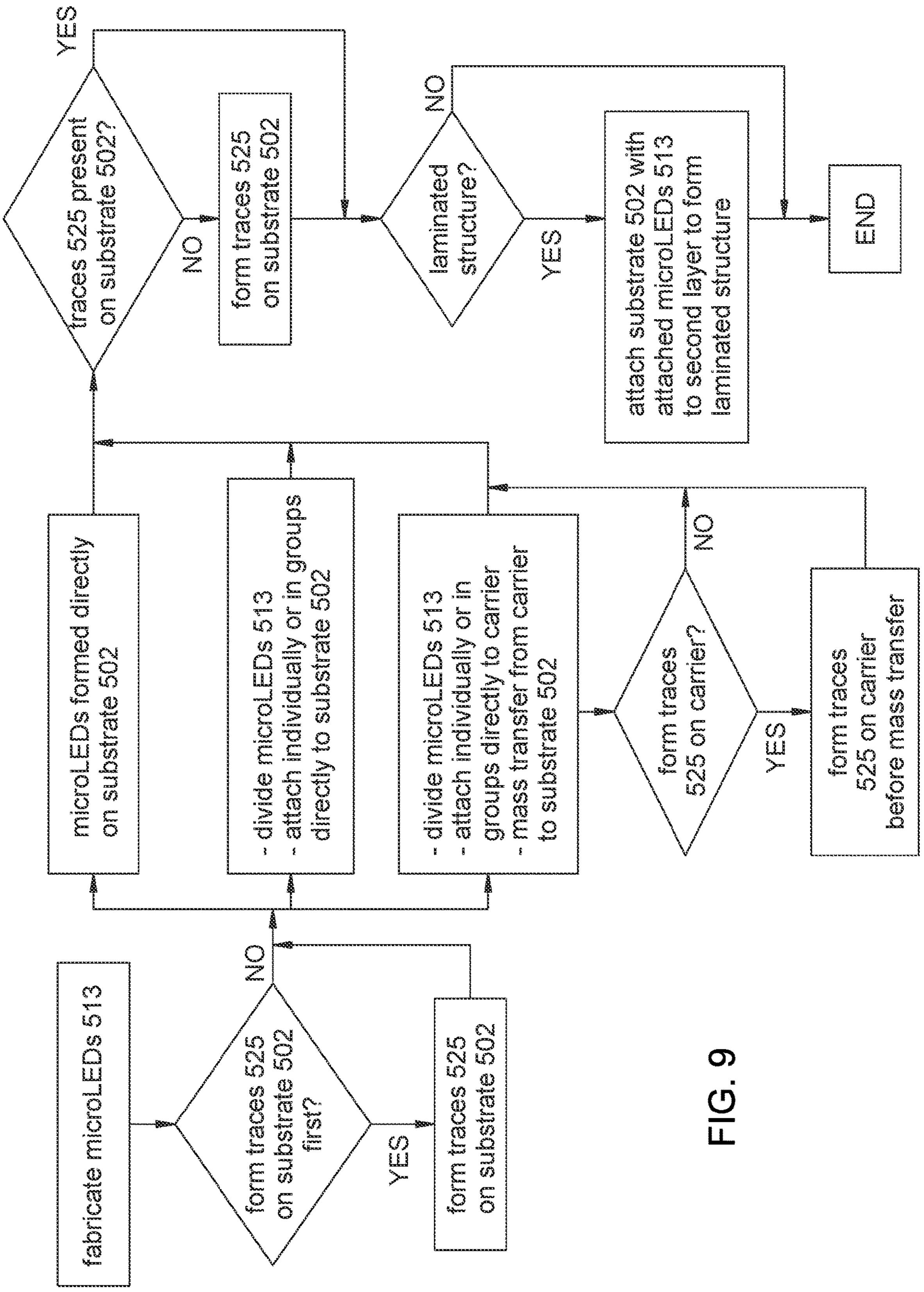
FIG. 9 is a flow diagram representing several methods for making a low-density set of light-emitting elements.

The light-emitting elements 513 can be formed on, retained on, attached to, or adhered to the substrate 502 (rigid or flexible) in any suitable way, for example by adhesive, welding or soldering, retention by a covering layer or structure, in situ fabrication or deposition on the substrate 502, transfer onto the substrate 502 from another substrate or carrier, and so forth. Similarly, the electrically conductive traces 525 can be formed on, retained on, attached to, or adhered to the substrate 502 in any suitable way (before, after, or concurrent with the light-emitting elements 513), for example by adhesive, welding or soldering, retention by a covering layer or structure, in situ fabrication or deposition on the substrate 502, transfer onto the substrate 502 from another substrate or carrier, and so forth. In some examples the light-emitting elements 513 and the electrically conductive traces 525 can be formed on, retained on, attached to, or adhered to the substrate 502 using distinct corresponding process sequences performed one after the other. In some other examples the light-emitting elements 513 and the electrically conductive traces 525 can both be formed on, retained on, attached to, or adhered to the substrate 502 in a single, integrated process sequence. In some examples each light-emitting element 513 can be transferred individually from a carrier (e.g., a substrate on which it was formed, or to which it was transferred after its formation) to the substrate 502 for attachment. In some other examples groups of multiple light-emitting elements 513 (comprising some or all of the set 511) can be transferred from such a carrier to the substrate 502 for attachment (e.g., by so-called mass transfer). Those examples and others included in the process diagram of FIG. 9.

Figure 8B:
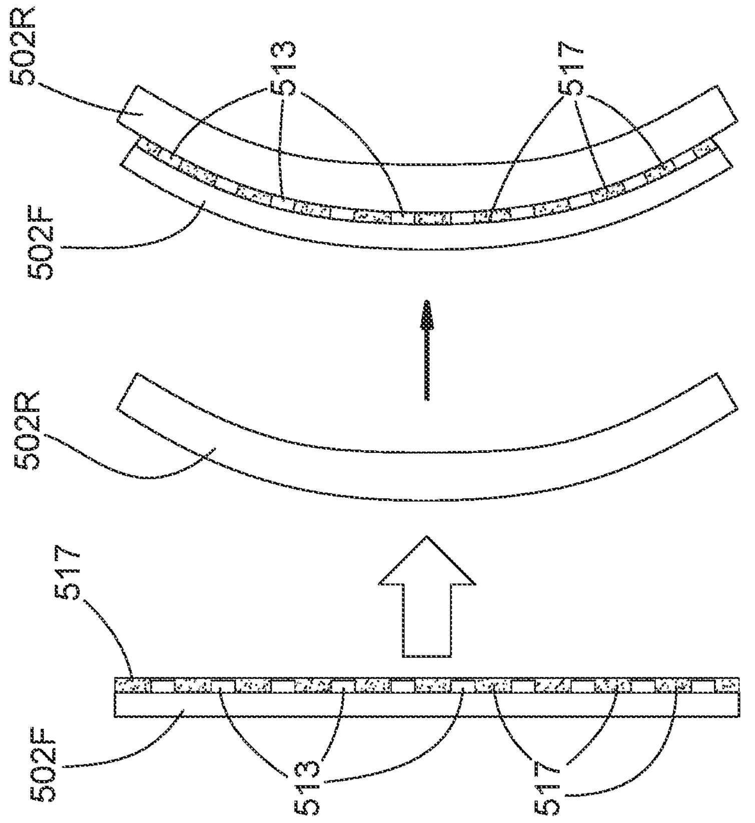
FIGS. 8A and 8B illustrate schematically a process for attaching a flexible polymer layer with a low-density set of light-emitting elements to flat and curved rigid layers, respectively.
Figure 8A:
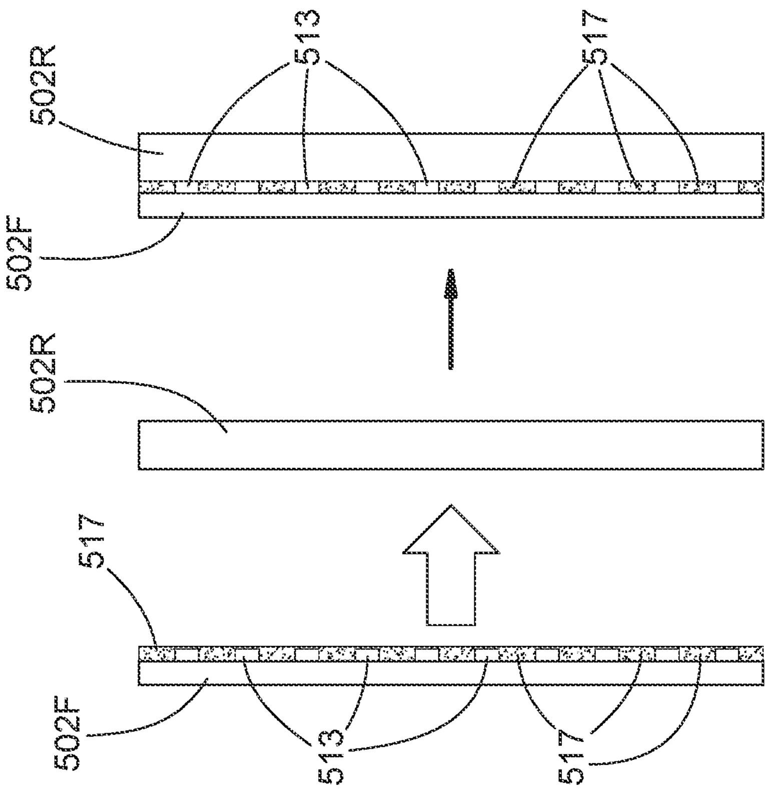

Specific examples are illustrated schematically in FIGS. 8A and 8B. The light-emitting elements 513 are disposed on a flexible polymer layer 502F, in many instances along with electrically conductive traces 525. In some instances the light-emitting elements 513 can be formed directly on the polymer layer 502F, typically with the layer 502F supported by an underlying rigid support; in some other instances the light-emitting elements 513 can be transferred to and attached to the polymer layer 502F. A layer of adhesive 517 can be applied to one or both of the flexible polymer layer 502F and a rigid layer 502R; the adhesive 517 is applied to the polymer layer 502F and the light-emitting elements 513 thereon in the examples shown in FIGS. 8A and 8B. The rigid substrate 502R can be flat (e.g., as in FIG. 8A) or curved (e.g., as in FIG. 8B) or otherwise non-planar (e.g., faceted). The flexible layer 502F and the rigid layer 502R are brought together (indicated by the large hollow arrow in FIGS. 8A and 8B) to form a laminated structure that is transparent for visible light, with the light-emitting elements 513 and the adhesive 517 between the layers 502F and 502R. In some examples the adhesive 517 can be cured or cross-linked to effect adhesion of the layers 502F and 502R. Any suitable adhesive can be employed; in some examples the adhesive includes one or more silicones, one or more epoxies, or one or more clear polyimides. In this example, before attachment of the polymer layer 502F to the rigid layer 502R, the polymer layer 502F corresponds to the substrate 502 described above. After attachment of the polymer layer 502F to the rigid layer 502R with the light-emitting elements 513 between them, the laminated structure formed by that attachment corresponds to the substrate 502 described above.

If the rigid layer 502R is curved (e.g., if the rigid layer 502R forms a curved lens or a curved visor or faceplate of a helmet or headset), the flexible polymer layer 502F can be deformed to conform to the curved shape of the rigid layer 502R. In that way it is possible to attach the light-emitting elements 513 to a rigid layer 502R of any desired or necessary shape while enabling fabrication of those light-emitting elements 513 on a planar wafer or substrate (typically required for using many semiconductor fabrication techniques used to form LEDs). The adhesive 517 adheres the layers 502F and 502R together and at least partly encapsulates the light-emitting elements 513 between them. When conforming the flexible polymer layer 502F to the shape of the rigid layer 502R (whether flat, curved, other otherwise nonplanar), attachment of the layers 502F/502R together can include taking steps to prevent, avoid, or eliminate bubbles or voids between the rigid layer 502R and the polymer layer 502F.

In some examples the flexible polymer layer 502F can remain in its flexible or deformable state after attachment to the rigid layer 502R. In some examples the polymer layer 502F can be cured or cross-linked after being positioned on and conformed to the rigid substrate 502R. In some of those latter examples the cured or cross-linked polymer layer 502F can be rigid after curing or cross-linking; in some other examples the cured or cross-linked polymer can remain somewhat flexible, pliable, or compressible. In some examples the polymer layer 502F can self-adhere to the rigid layer 502R, i.e., acting as its own adhesive. In some examples the flexible polymer layer 502F can include one or more materials among clear polyimide (PI), polyethylene naphthalate (PEN), polyethylene terephthalate (PET), or other flexible or curable transparent polymer. In some examples the rigid layer 502R can include one or more materials among silica, optical glasses, polycarbonate, polymethylmethacrylate (PMMA), other rigid transparent polymers, or other rigid transparent materials.

Figure 6:
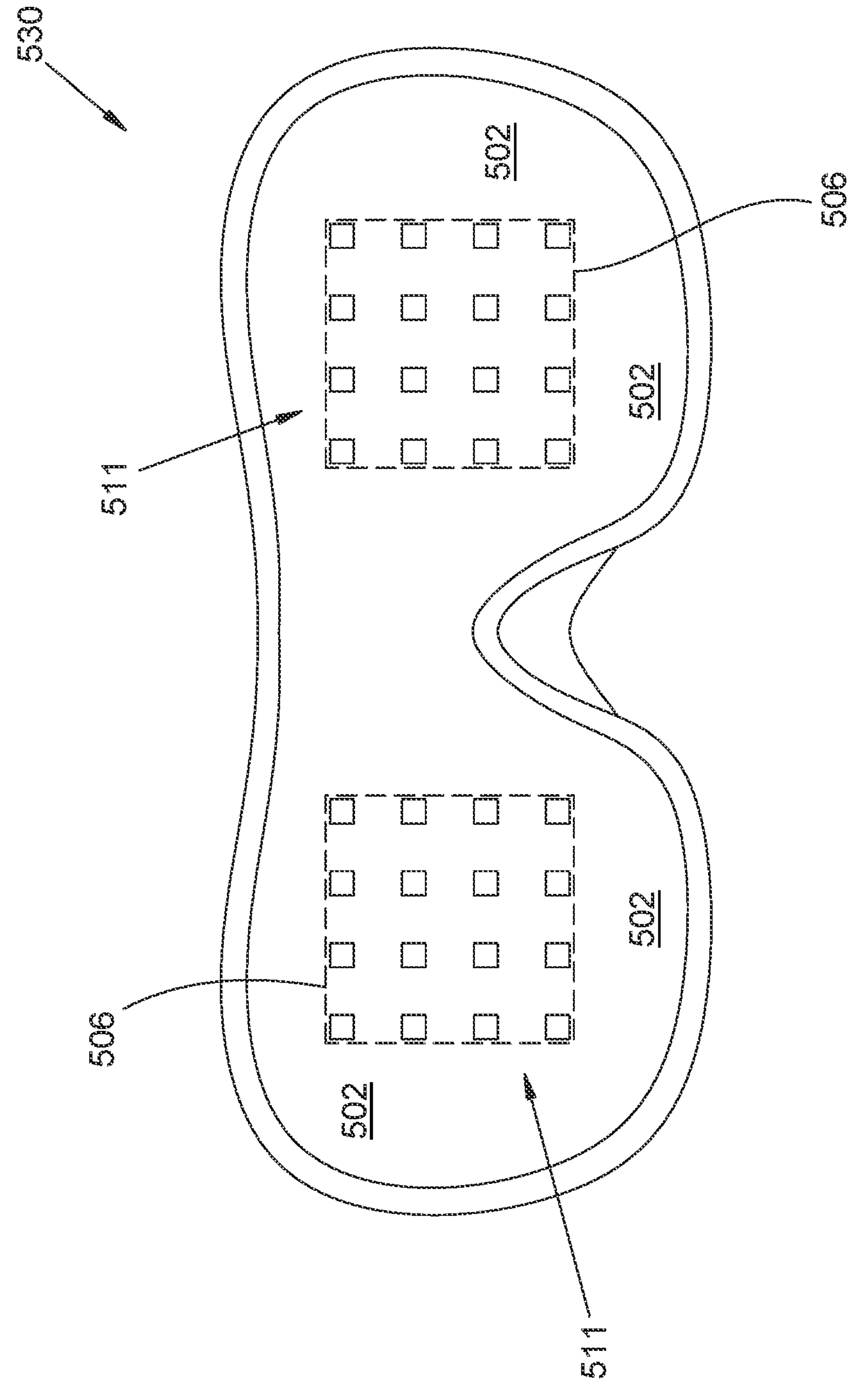
FIG. 6 illustrates schematically low-density sets of light-emitting elements on eyewear.
Figure 7:
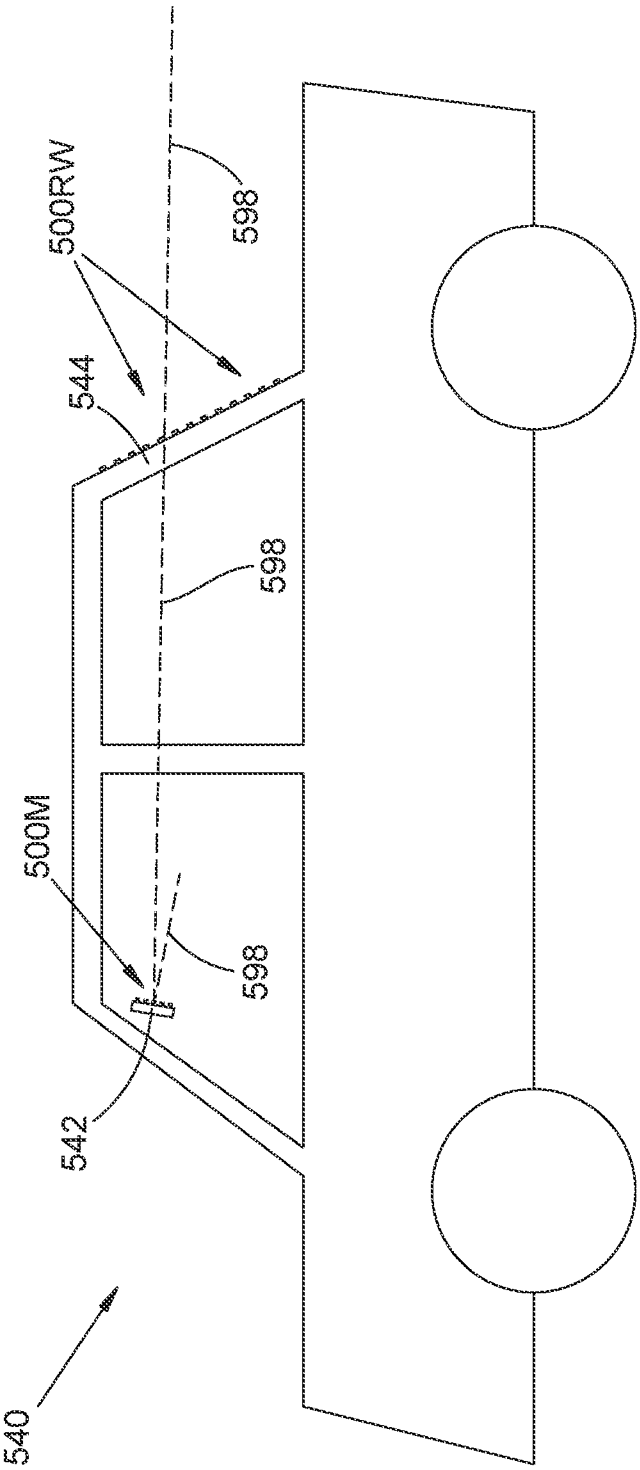
FIG. 7 illustrates schematically low-density sets of light emitting elements on a vehicle.

In any application (including examples described herein) wherein the light-emitting elements 513 are employed for any sort of sensing or detection, a sensor or detector or imaging device of any suitable type (generically labelled 585 in FIG. 10B) can be employed to receive light 581 emitted by the illuminating light-emitting elements 513 and then reflected or scattered from the human observer or from people or objects within the scene 600. In the example of FIG. 6, the detector or sensor 585 might be located on the frame of the eyewear 530; in the example of FIG. 7, the detector or sensor 585 might be located on a frame around the rearview mirror 542 or around the rear window 544; any suitable location can be employed. A computer or other suitable processing system or control circuit (generically labelled 553 in FIG. 10B) typically would be employed to interpret the acquired signals or images according to a suitable algorithm or protocol. In the AR/VR example, an infrared image sensor 585 can receive infrared light, emitted as output light 581 by the light-emitting elements 513 on the AR/VR eyewear or headset 530, that is scattered or reflected from the user's eyes. A computer or processor or control circuit 553 operatively coupled to the sensor or detector 585 can estimate or determine a direction of the user's gaze using a suitable eye-tracking algorithm, and the AR/VR system can be further programmed to alter the AR/VR imagery presented to the user using the display 699 (e.g., highlighting a person or object in the scene 600, displaying a reticle or crosshair superimposed on the scene 600, displaying data or information superimposed on the scene 600 pertaining to a person or object in the scene 600, and so on).

In addition to the preceding, the following example embodiments fall within the scope of the present disclosure or appended claims. Any given Example below that refers to "any preceding Example" shall be understood to refer to those preceding Examples with which the given Example is not inconsistent.

Example 1. A light source comprising: (a) a substrate that is transparent or reflective for visible light; and (b) a set of multiple light-emitting elements positioned on or within the substrate, each light-emitting element comprising one or more inorganic microLEDs that are arranged to generate and emit output light to propagate out-of-plane relative to a corresponding localized area of the substrate around that light-emitting element, (c) each light-emitting element of the set being sufficiently small in at least one transverse dimension, and the light-emitting elements occupying a sufficiently small fraction of an areal extent of the set, so as to enable visual observation of a scene through or reflected by the substrate along a sight line that passes through the set of light-emitting elements.

Example 2. The light source of Example 1, the substrate being transparent for visible light, and the light source being arranged so as to enable visual observation of the scene through the substrate along the sight line that passes through the set of light-emitting elements.

Example 3. The light source of any one of Examples 1 or 2, the substrate being reflective for visible light, and the light source being arranged so as to enable visual observation of the scene reflected by the substrate along the sight line that passes through the set of light-emitting elements.

Example 4. The light source of any preceding Example, each light-emitting element of the set being arranged and connected so as to be operable independently of at least one other light-emitting element of the set, or independently of all other light-emitting elements of the set.

Example 5. The light source of any preceding Example, one or more or all of the microLEDs being arranged to generate and emit visible output light.

Example 6. The light source of any preceding Example, one or more of all of the microLEDs comprising UV- or visible-emitting, direct-emitting or phosphor-converted, semiconductor microLEDs, each microLED including one or more materials among III-V, II-VI, or Group IV semiconductor materials.

Example 7. The light source of any preceding Example, one or more or all of the microLEDs being arranged to generate and emit non-visible output light.

Example 8. The light source of any preceding Example, one or more or all of the microLEDs comprising infrared-emitting, direct-emitting or phosphor-converted, semiconductor microLEDs, each microLED including one or more materials among III-V, II-VI, or Group IV semiconductor materials.

Example 9. The light source of any preceding Example, one or more or all of the light-emitting elements of the set each including only a single microLED.

Example 10. The light source of any preceding Example, one or more or all of the light-emitting elements of the set each including multiple microLEDs, each microLED of a given light-emitting element being arranged and connected so as to be operable independently of at least one other microLED of that light-emitting element, or independently of all other light-emitting elements of that light-emitting element.

Example 11. The light source of any preceding Example, one or more or all of the microLEDs including a wavelength-converting structure.

Example 12. The light source of any preceding Example, each light-emitting element having a largest transverse dimension that is less than 200 μm, less than 100 μm, less than 50 μm, less than 30 μm, less than 20 μm, less than 10 μm, less than 8 μm, less than 5 μm, or even smaller.

Example 13. The light source of any preceding Example, the light-emitting elements occupying less than 25% of the areal extent of the set, less than 10%, less than 5%, less than 2%, less than 1%, less than 0.5%, less than 0.2%, less than 0.1%, less than 0.05%, less than 0.02%, less than 0.01%, less than 0.005%, less than 0.002%, less than 0.001%, or even smaller.

Example 14. The light source of any preceding Example, the set of light-emitting elements occupying an area of the substrate having a smallest transverse dimension that is greater than 5 mm, greater than 10 mm, greater than 20 mm, greater than 30 mm, greater than 50 mm, greater than 100 mm, greater than 200 mm, greater than 500 mm, or even larger.

Example 15. The light source of any one of Examples 1 through 14, the entire substrate being planar.

Example 16. The light source of any one of Examples 1 through 14, the substrate including one or more areal regions that are curved, or two or more planar areal regions that are not coplanar with respect to one another.

Example 17. The light source of any one of Examples 1 through 16, the substrate being flexible.

Example 18. The light source of any one of Examples 1 through 16, the substrate being rigid.

Example 19. The light source of any preceding Example, each light-emitting element being sufficiently small in at least one transverse dimension, and the light-emitting elements of the set being spaced sufficiently far apart, so that, with the light-emitting elements in an off state or emitting only non-visible light, the set does not substantially interfere with visual observation of the scene through or reflected by the substrate by a naked eye of a human observer along the sight line that passes through the set.

Example 20. The light source of any preceding Example, each light-emitting element being sufficiently small in at least one transverse dimension, and the light-emitting elements of the set being spaced sufficiently far apart, so that to a naked eye of a human observer the set is only negligibly visible when in an off state or when emitting only non-visible light.

Example 21. The light source of any preceding Example, each light-emitting element being sufficiently small in at least one transverse dimension, and the light-emitting elements of the set being spaced sufficiently far apart, so that to a naked eye of a human observer the set resembles dust on the substrate when in an off state or when emitting only non-visible light.

Example 22. The light source of any preceding Example further comprising multiple electrically conductive traces on or within the substrate that are arranged and connected for providing electrical drive current to the light-emitting elements of the set, the traces being sufficiently transparent, sufficiently narrow, or spaced sufficiently far apart so as to enable visual observation of the scene through or reflected by the substrate along the sight line that passes through the set of light-emitting elements and the set of electrically conductive traces.

Example 23. An apparatus comprising: (a) a substrate that is transparent for visible light; and (b) a set of multiple electrically conductive traces on or within the substrate, the electrically conductive traces being sufficiently transparent, or being less than 200 μm wide and occupying less than 25% of an areal extent of the set, so as to enable visual observation of a scene through the substrate along a sight line that passes through the set of electrically conductive traces.

Example 24. An apparatus comprising: (a) a substrate that is reflective for visible light; and (b) a set of multiple electrically conductive traces on or within the substrate, the electrically conductive traces being sufficiently transparent, or being less than 200 μm wide and occupying less than 25% of an areal extent of the set, so as to enable visual observation of a scene reflected by the substrate along a sight line that passes through the set of electrically conductive traces.

Example 25. The apparatus of any one of Examples 22 through 24, the set of electrically conductive traces including one or more materials among indium tin oxide (ITO), indium zinc oxide (IZO), or one or more other transparent conductive oxides (TCOs).

Example 26. The apparatus of any one of Examples 22 through 25, the set of electrically conductive traces including one or more materials among aluminum, silver, gold, or one or more other metals or metallic alloys.

Example 27. The apparatus of any one of Examples 22 through 26, the electrically conductive traces being less than 200 μm, less than 100 μm, less than 50 μm, less than 30 μm, less than 20 μm, less than 10 μm, less than 8 μm, less than 5 μm, or even smaller.

Example 28. The apparatus of any one of Examples 22 through 27, the electrically conductive traces occupying less than 25% of the areal extent of the set, less than 10%, less than 5%, less than 2%, less than 1%, less than 0.5%, less than 0.2%, less than 0.1%, less than 0.05%, less than 0.02%, less than 0.01%, less than 0.005%, less than 0.002%, less than 0.001%, or even smaller.

Example 29. The apparatus of any one of Examples 22 through 28, the set of electrically conductive traces occupying an area of the substrate having a smallest transverse dimension that is greater than 5 mm, greater than 10 mm, greater than 20 mm, greater than 30 mm, greater than 50 mm, greater than 100 mm, greater than 200 mm, greater than 500 mm, or even larger.

Example 30. The apparatus of any one of Examples 22 through 29, the electrically conductive traces being sufficiently transparent, or sufficiently narrow and spaced sufficiently far apart, so that the set does not substantially interfere with visual observation of the scene through or reflected by the substrate by a naked eye of a human observer along the sight line that passes through the set.

Example 31. The apparatus of any one of Examples 22 through 30, the electrically conductive traces being sufficiently transparent, or sufficiently narrow and spaced sufficiently far apart, so that to a naked eye of a human observer the set is only negligibly visible.

Example 32. The apparatus of any one of Examples 22 through 31, the electrically conductive traces being sufficiently transparent, or sufficiently narrow and spaced sufficiently far apart, so that to a naked eye of a human observer the set resembles hair or dust on the substrate.

Example 33. The light source of any preceding Example, the substrate comprising a rigid layer and a polymer layer attached to the rigid layer, the rigid layer and the polymer layer forming a laminated structure that is transparent for visible light, the set of multiple light-emitting elements being positioned between the rigid layer and the polymer layer.

Example 34. A light source comprising: (a) a rigid layer; (b) a polymer layer attached to the rigid layer, the rigid layer and the polymer layer forming a laminated structure that is transparent for visible light; and (c) a set of multiple light-emitting elements positioned between the rigid layer and the polymer layer, each light-emitting element comprising one or more inorganic microLEDs that are arranged to generate and emit output light to propagate out-of-plane relative to a corresponding localized area of the laminated structure surrounding that light-emitting element, (d) each light-emitting element of the set being sufficiently small in at least one transverse dimension, and the light-emitting elements occupying a sufficiently small fraction of an areal extent of the set, so as to enable visual observation of a scene through the laminated structure along a sight line that passes through the set of light-emitting elements.

Example 35. The light source of any one of Examples 33 or 34 further comprising an adhesive layer between the rigid layer and the polymer layer, the adhesive layer adhering together the rigid layer and the polymer layer and at least partly encapsulating the set of light-emitting elements, the adhesive layer being transparent for visible light.

Example 36. The light source of any one of Examples 33 or 34, the polymer layer self-adhering to the rigid layer and at least partially encapsulating the set of light-emitting elements.

Example 37. The light source of any one of Examples 33 through 36, the entire rigid layer being planar.

Example 38. The light source of any one of Examples 33 through 36, the rigid layer including one or more areal regions that are curved, or two or more planar areal regions that are not coplanar with respect to one another.

Example 39. The light source of any one of Examples 33 through 38, the polymer layer being flexible.

Example 40. The light source of any one of Examples 33 through 38, the polymer layer comprising a rigid layer of cured or cross-linked polymer material.

Example 41. The light source of any one of the preceding Examples, (i) the polymer layer including one or more polymeric materials among clear polyimide (PI), polyethylene naphthalate (PEN), polyethylene terephthalate (PET), or other flexible or curable or cross-linked transparent polymer, or (ii) the rigid layer including one or more materials among silica, optical glasses, polycarbonate, polymethylmethacrylate (PMMA), or other rigid transparent polymers.

Example 42. A method for making the light source of any one of the preceding Examples, the method comprising: (A) providing the set of multiple light-emitting elements disposed on the polymer layer; and (B) attaching the rigid layer to the polymer layer with the set of light-emitting elements therebetween, the rigid layer and the polymer layer forming the laminated structure, (C) wherein, before attachment to the rigid layer, the polymer layer is flexible.

Example 43. A method comprising: (A) providing a set of multiple light-emitting elements disposed on a flexible polymer layer, each light-emitting element comprising one or more inorganic microLEDs that are arranged to generate and emit output light to propagate out-of-plane relative to a corresponding localized area of the polymer layer surrounding that light-emitting element; and (B) attaching a rigid layer to the polymer layer with the set of light-emitting elements therebetween, the rigid layer and the polymer layer forming a laminated structure that is transparent for visible light, each light-emitting element of the set being sufficiently small in at least one transverse dimension, and the light-emitting elements occupying a sufficiently small fraction of an areal extent of the set, so as to enable visual observation of a scene through the laminated structure along a sight line that passes through the set of light-emitting elements.

Example 44. The method of any one of Examples 42 or 43 wherein providing the set of light-emitting elements includes transferring individually each light-emitting element from a carrier onto the polymer layer.

Example 45. The method of any one of Examples 42 or 43 wherein providing the set of light-emitting elements includes transferring simultaneously groups of multiple light-emitting elements from a carrier onto the polymer layer.

Example 46. The method of any one of Examples 42 through 45, each light-emitting element of the set including multiple microLEDs, the method further comprising arranging and connecting each microLED of a given light-emitting element so as to be operable independently of at least one other light emitter of that light-emitting element.

Example 47. The method of any one of Examples 42 through 46, further comprising arranging and connecting each light-emitting element of the set so as to be operable independently of at least one other light-emitting element of the set.

Example 48. The method of any one of Examples 42 through 47 further comprising forming on the polymer layer multiple electrically conductive traces that are arranged and connected for providing electrical drive current to the light-emitting elements of the set, the traces being sufficiently transparent, sufficiently narrow, or spaced sufficiently far apart so as to enable visual observation of the scene through the laminated structure along the sight line that passes through the set of light-emitting elements.

Example 49. The method of any one of Examples 42 through 48 further comprising applying an adhesive layer between the rigid layer and the polymer layer, the adhesive layer adhering together the rigid layer and the polymer layer and at least partly encapsulating the set of light-emitting elements, the adhesive layer being transparent for visible light.

Example 50. The method of any one of Examples 42 through 48, the polymer layer self-adhering to the rigid layer and at least partially encapsulating the set of light-emitting elements.

Example 51. The method of any one of Examples 42 through 50 wherein attaching the rigid layer to the polymer layer includes preventing, avoiding, or eliminating bubbles or voids between the rigid layer and the polymer layer.

Example 52. The method of any one of Examples 42 through 51, the polymer layer remaining flexible after attachment to the rigid layer.

Example 53. The method of any one of Examples 42 through 52 wherein attaching the rigid layer to the polymer layer includes curing or cross-linking the polymer layer.

Example 54. The method of Example 53, the polymer layer being rigid after curing or cross-linking.

Example 55. The method of any one of Examples 53 or 54, the polymer layer self-adhering to the rigid layer after curing or cross-linking.

Example 56. A method for operating the light source of any one of Examples 1 through 41, the method comprising, with the substrate positioned in a sight line along which a scene is observed through the substrate by an observer, operating the set of multiple light-emitting elements to emit the output light.

Example 57. The method of Example 56, some or all of the output light being directed toward the observer.

Example 58. The method of any one of Examples 56 or 57, some or all of the output light being directed toward the scene.

Example 59. A method for operating the light source of any one of Examples 1 through 41, the method comprising, with the substrate positioned in a sight line along which a scene is observed reflected by the substrate by an observer, operating the set of multiple light-emitting elements to emit the output light.

Example 60. A method for operating the apparatus of any one of Examples 22 through 41, method comprising, with the substrate positioned in a sight line along which a scene is observed through the substrate by an observer, delivering one or more electrical signals or drive currents through one or more of the electrically conductive traces.

Example 61. A wearable optical assembly incorporating the light source of any one of Examples 1 through 41, the optical assembly being structurally configured so as to position the substrate in the sight line of a user wearing the optical assembly, some or all the light-emitting elements being arranged to generate and emit infrared output light, the optical assembly being structurally configured so that the output light propagates toward an eye or face of the user wearing the optical assembly.

Example 62. A wearable optical assembly comprising: (a) an optical element (such as a substrate) that is transparent for visible light, the optical assembly being structurally configured so as to position the optical element in a sight line of a user wearing the optical assembly; and (b) a set of multiple light-emitting elements positioned on or within the optical element, each light-emitting element comprising one or more inorganic microLEDs that are arranged to generate and emit infrared output light to propagate out-of-plane relative to a corresponding localized area of the optical element around that light-emitting element, the optical assembly being structurally configured so that the output light propagates toward an eye or face of the user wearing the optical assembly, (c) each light-emitting element of the set being sufficiently small in at least one transverse dimension, and the light-emitting elements occupying a sufficiently small fraction of an areal extent of the set, so as to enable visual observation of a scene, by the user wearing the optical assembly, through the optical element along the sight line of the user, the sight line passing through the set of light-emitting elements.

Example 63. The wearable optical assembly of any one of Examples 61 or 62 further comprising: one or more infrared detectors or infrared image sensors, the optical assembly being structurally configured so as to position the one or more infrared detectors or infrared image sensors for receiving portions of the infrared output light scattered or reflected from an eye or face of the user wearing the optical assembly, the one or more infrared detectors or infrared image sensors being arranged for generating corresponding electronic signals indicative of the received scattered or reflected light; and one or more electronic circuits or electronic processors structured, connected, or programmed (i) for receiving one or more of the electronic signals generated by one or more of the infrared detectors or infrared image sensors, and (ii) for eye tracking, facial recognition, or optical biometric measurement based on one or more of the electronic signals received from the one or more infrared detectors or infrared image sensors.

Example 64. The wearable optical assembly of any one of Examples 61 through 63, the wearable optical assembly being arranged as eyeglasses, eyewear, goggles, a headset, a helmet, or a head-mounted device, the optical element forming at least a portion of a window, lens, eyepiece, display screen, faceplate, or visor of the wearable optical assembly.

Example 65. A method comprising, with a user wearing the wearable optical assembly of any one of Examples 61 through 64, operating the set of multiple light-emitting elements to generate and emit the infrared output light to propagate toward an eye or face of the user wearing the optical assembly.

Example 66. The method of Example 65 further comprising: receiving at one or more infrared detectors or infrared image sensors portions of the infrared output light scattered or reflected from an eye or face of the user wearing the optical assembly, and generating corresponding electronic signals indicative of the received scattered or reflected light; and based at least in part on one or more of the electronic signals generated by and received from the one or more infrared detectors or infrared image sensors, using one or more electronic circuits or electronic processors structured, connected, or programmed therefor, (i) tracking movement of one or both eyes of the user wearing the optical assembly, (ii) recognizing a face of the user wearing the optical assembly, or (iii) making an optical biometric measurement of the user wearing the optical assembly.

Example 67. The method of Example 66 further comprising, based at least in part on one or more of the electronic signals generated by and received from the one or more infrared detectors or infrared image sensors, using one or more electronic circuits or electronic processors structured, connected, or programmed therefor, (i) tracking movement of one or both eyes of the user wearing the optical assembly, and (ii) based at least in part on the tracked eye movement, taking one or more actions among illuminating a selected portion of the scene, highlighting a selected portion of the scene, or presenting to the wearer of the optical assembly alphanumeric or graphic information superimposed on the scene in the sight line of the user wearing the optical assembly.

This disclosure is illustrative and not limiting. Further modifications will be apparent to one skilled in the art in light of this disclosure and are intended to fall within the scope of the present disclosure or appended claims. It is intended that equivalents of the disclosed example embodiments and methods, or modifications thereof, shall fall within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of any single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words “comprising,” “including,” “having,” and variants thereof, wherever they appear, shall be construed as open ended terminology, with the same meaning as if a phrase such as “at least” were appended after each instance thereof, unless explicitly stated otherwise. The article “a” shall be interpreted as “one or more” unless “only one,” “a single,” or other similar limitation is stated explicitly or is implicit in the particular context; similarly, the article “the” shall be interpreted as “one or more of the” unless “only one of the,” “a single one of the,” or other similar limitation is stated explicitly or is implicit in the particular context. The conjunction “or” is to be construed inclusively unless: (i) it is explicitly stated otherwise, e.g., by use of “either . . . or,” “only one of,” or similar language; or (ii) two or more of the listed alternatives are understood or disclosed (implicitly or explicitly) to be incompatible or mutually exclusive within the particular context. In that latter case, “or” would be understood to encompass only those combinations involving non-mutually-exclusive alternatives. In one example, each of “a dog or a cat,” “one or more of a dog or a cat,” and “one or more dogs or cats” would be interpreted as one or more dogs without any cats, or one or more cats without any dogs, or one or more of each.

For purposes of the present disclosure or appended claims, when a numerical quantity is recited (with or without terms such as “about,” “about equal to,” “substantially equal to,” “greater than about,” “less than about,” and so forth), standard conventions pertaining to measurement precision, rounding error, and significant digits shall apply, unless a differing interpretation is explicitly set forth. For null quantities described by phrases such as “prevented,” “absent,” “eliminated,” “equal to zero,” “negligible,” and so forth (with or without terms such as “substantially” or “about”), each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word “means” will appear in that apparatus claim. If those provisions are desired to be invoked in a method claim, the words “a step for” will appear in that method claim. Conversely, if the words “means” or “a step for” do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A light source comprising:

a rigid layer;

a polymer layer attached to the rigid layer, the rigid layer and the polymer layer forming a laminated structure that is reflective for visible light; and a set of multiple light-emitting elements positioned between the rigid layer and the polymer layer, each light-emitting element comprising one or more inorganic microLEDs that are arranged to generate and emit output light to propagate out-of-plane relative to a corresponding localized area of the laminated structure surrounding that light-emitting element, each light-emitting element of the set being sufficiently small in at least one transverse dimension, and the light-emitting elements occupying a sufficiently small fraction of an areal extent of the set, so as to enable visual observation of a scene reflected by the laminated structure along a sight line that passes through the set of light-emitting elements.

2. The light source of claim 1, each light-emitting element of the set including multiple microLEDs, each microLED of a given light-emitting element being arranged and connected so as to be operable independently of at least one other microLED of that light-emitting element.

3. The light source of claim 1, each light-emitting element of the set including only a single microLED.

4. The light source of claim 1, each light-emitting element of the set being arranged and connected so as to be operable independently of at least one other light-emitting element of the set.

5. The light source of claim 1, each light-emitting element comprising one or more direct-emitting or phosphor-converted inorganic semiconductor microLEDs, the microLEDs including one or more UV-, visible-, or infrared-emitting microLEDs, each microLED including one or more materials among III-V, II-VI, or Group IV semiconductor materials.

6. The light source of claim 1, one or more of the light-emitting elements including corresponding wavelength-converting structures.

7. The light source of claim 1 further comprising multiple electrically conductive traces on or within the polymer layer that are arranged and connected for providing electrical drive current to the light-emitting elements of the set, the traces being sufficiently transparent, sufficiently narrow, or spaced sufficiently far apart so as to enable visual observation of the scene reflected by the laminated structure along the sight line that passes through the set of light-emitting elements.

8. The light source of claim 1, each light-emitting element having a largest transverse dimension that is less than 200 um.

9. The light source of claim 1, the light-emitting elements occupying less than 25% of the areal extent of the set.

10. The light source of claim 1, the set of light-emitting elements occupying an area of the laminated structure having a smallest transverse dimension that is greater than 5 mm.

11. The light source of claim 1 further comprising an adhesive layer between the rigid layer and the polymer layer, the adhesive layer adhering together the rigid layer and the polymer layer and at least partly encapsulating the set of light-emitting elements, the adhesive layer being transparent for visible light.

12. The light source of claim 1, the entire rigid layer being planar.

13. The light source of claim 1, the rigid layer including one or more areal regions that are curved, or two or more planar areal regions that are not coplanar with respect to one another.

14. The light source of claim 1, the polymer layer being flexible.

15. The light source of claim 1, the polymer layer comprising a rigid layer of cured or cross-linked polymer material.

16. The light source of claim 1, (i) the polymer layer including one or more polymeric materials among clear polyimide (PI), polyethylene naphthalate (PEN), polyethylene terephthalate (PET), or other flexible or curable or cross-linked transparent polymer, or (ii) the rigid layer including one or more materials among silica, optical glasses, polycarbonate, polymethylmethacrylate (PMMA), or other rigid transparent polymers.

17. The light source of claim 1, each light-emitting element being sufficiently small in at least one transverse dimension, and the light-emitting elements of the set being spaced sufficiently far apart, so that, with the light-emitting elements in an off state or emitting only non-visible light, the set does not substantially interfere with visual observation of the scene through of reflected by the substrate by a naked eye of a human observer along the sight line that passes through the set.

18. The light source of claim 1, each light-emitting element being sufficiently small in at least one transverse dimension, and the light-emitting elements of the set being spaced sufficiently far apart, so that to a naked eye of a human observer the set is only negligibly visible when in an off state or when emitting only non-visible light.

19. A method comprising, with a laminated structure positioned in a sight line along which a scene reflected by the laminated structure is observed by an observer, the laminated structure being reflective for visible light and comprising a rigid layer and a polymer layer attached to the rigid layer, operating a set of multiple light-emitting elements positioned between the polymer layer and the rigid layer to emit output light, each light-emitting element comprising one or more inorganic microLEDs that are arranged to generate and emit the output light to propagate out-of-plane relative to a corresponding localized area of the laminated structure around that light-emitting element, and each light-emitting element of the set being sufficiently small in at least one transverse dimension, and the light-emitting elements occupying a sufficiently small fraction of an areal extent of the set, so as to enable visual observation of the scene reflected by the laminated structure along the sight line that passes through the set of light-emitting elements.

* * * * *